US012653022B2

(12) United States Patent
Chang et al.

(10) Patent No.: US 12,653,022 B2
(45) Date of Patent: Jun. 9, 2026

(54) VERTICAL TRANSISTORS OCCUPYING REDUCED CHIP AREA AND THE METHODS FORMING THE SAME

(71) Applicant: Taiwan Semiconductor Manufacturing Co., Ltd., Hsinchu (TW)

(72) Inventors: Shang-Wen Chang, Jhubei City (TW); Cheng-Chi Chuang, New Taipei City (TW); Ching-Wei Tsai, Hsinchu City (TW); Yi-Hsun Chiu, Zhubei City (TW); Yu-Xuan Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 441 days.

(21) Appl. No.: 18/184,085

(22) Filed: Mar. 15, 2023

(65) Prior Publication Data

US 2024/0312913 A1    Sep. 19, 2024

(51) Int. Cl.
| | |
|---|---|
| *H10W 20/41* | (2026.01) |
| *H10D 30/01* | (2025.01) |
| *H10D 30/63* | (2025.01) |
| *H10D 64/23* | (2025.01) |
| *H10D 84/01* | (2025.01) |
| *H10D 84/03* | (2025.01) |
| *H10D 84/85* | (2025.01) |
| *H10P 95/00* | (2026.01) |

(52) U.S. Cl.
CPC ........ *H10W 20/427* (2026.01); *H10D 30/025* (2025.01); *H10D 30/63* (2025.01); *H10D 64/252* (2025.01); *H10D 84/017* (2025.01); *H10D 84/0186* (2025.01); *H10D 84/0195* (2025.01); *H10D 84/038* (2025.01); *H10D 84/85* (2025.01); *H10P 95/11* (2026.01)

(58) Field of Classification Search
CPC ............. H01L 23/5286; H01L 21/7806; H01L 21/743; H10D 30/025; H10D 30/63; H10D 64/252; H10D 84/017; H10D 84/0186; H10D 84/0195; H10D 84/038; H10D 84/85
See application file for complete search history.

(56) References Cited

U.S. PATENT DOCUMENTS

| | | | |
|---|---|---|---|
| 12,063,766 B2 | 8/2024 | Yang et al. | |
| 2020/0381300 A1* | 12/2020 | Zhang | ................ H10D 30/6728 |

(Continued)

FOREIGN PATENT DOCUMENTS

| | | |
|---|---|---|
| TW | 202243140 A | 11/2022 |

*Primary Examiner* — Yasser A Abdelaziez
(74) *Attorney, Agent, or Firm* — Slater Matsil, LLP

(57) ABSTRACT

A method includes forming a vertical transistor, and the method includes forming a vertical semiconductor bar over a substrate, forming a gate dielectric and a gate electrode encircling the vertical semiconductor bar, forming a first source/drain region over a top surface of the vertical semiconductor bar, removing the substrate to reveal a bottom surface of the vertical semiconductor bar; and forming a second source/drain region contacting the bottom surface of the vertical semiconductor bar. The method further includes forming a backside power line, with the backside power line being on a bottom side of the vertical semiconductor bar. The backside power line is connected to the second source/drain region.

20 Claims, 24 Drawing Sheets

(56) References Cited

U.S. PATENT DOCUMENTS

| | | | |
|---|---|---|---|
| 2022/0077062 A1* | 3/2022 | Van Dal | H10D 84/85 |
| 2022/0093489 A1* | 3/2022 | Do | H10D 89/10 |
| 2022/0123023 A1* | 4/2022 | Peng | H10D 86/441 |
| 2023/0067311 A1* | 3/2023 | Lai | H10D 30/43 |

* cited by examiner

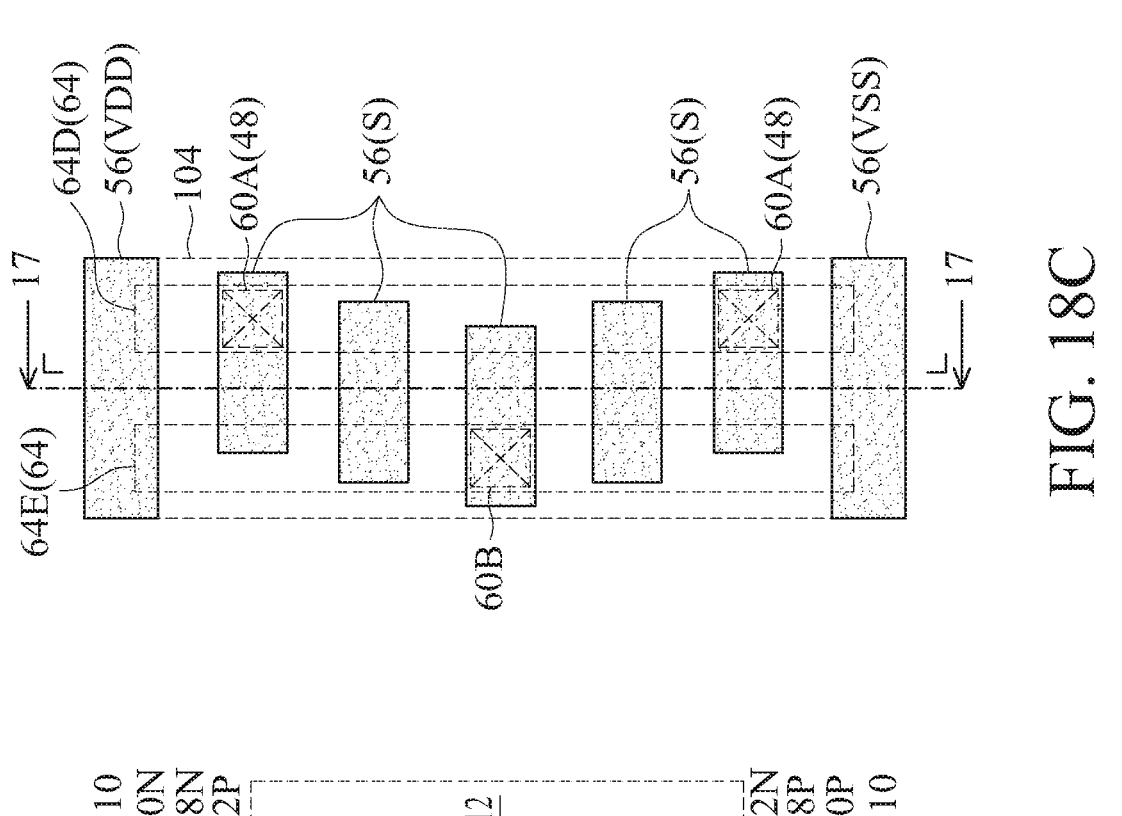
FIG. 18C
FIG. 18B
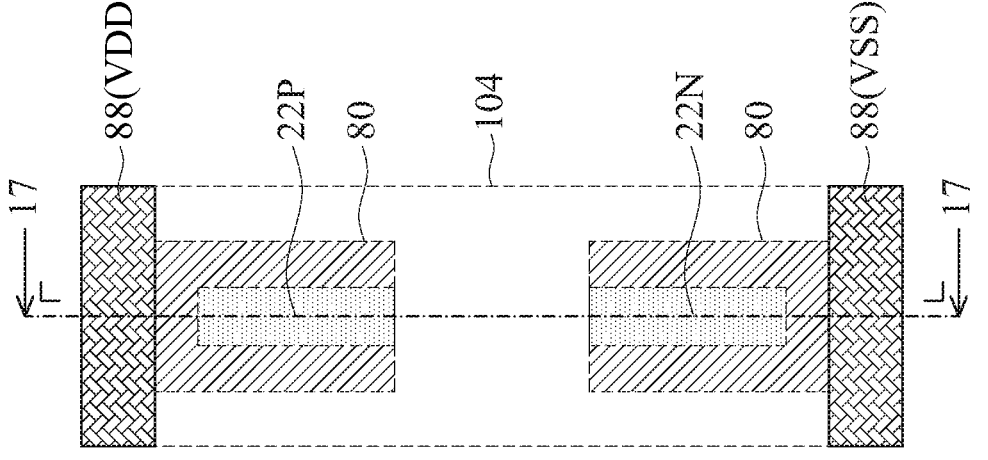
FIG. 18A

VERTICAL TRANSISTORS OCCUPYING REDUCED CHIP AREA AND THE METHODS FORMING THE SAME

BACKGROUND

Transistors are key components of modern integrated circuits. To satisfy the requirements of increasingly faster switching speed, the drive currents of transistors need to be increasingly higher. At the same time, the gate lengths of transistors are constantly being scaled down. Scaling down the gate lengths leads to undesirable effects known as "short-channel effects," with which the control of current flow by the gates is compromised. Among the short-channel effects are the drain-induced barrier lowering (DIBL) and the degradation of sub-threshold slope, both of which result in the degradation in the performance of transistors.

The use of multi-gate transistor architecture may help the relief of short-channel effects by improving electrostatic control of the gate on the channel. Fin field-effect transistors (FinFET) were thus developed. To further increase the control of the channels, and to reduce the short-channel effects, transistors having vertical gate-all-around structures were also developed, wherein the respective transistors are also referred to as Vertical Gate All Around (VGAA) transistors. In a VGAA transistor, a gate dielectric and a gate electrode fully encircle a channel region. This configuration delivers a good control of the channel, and the short-channel effects are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18A, 18B, and 18C illustrate the top views at different levels of an inverter comprising double-side powered vertical transistors in accordance with some embodiments.

DETAILED DESCRIPTION

Figure 1:
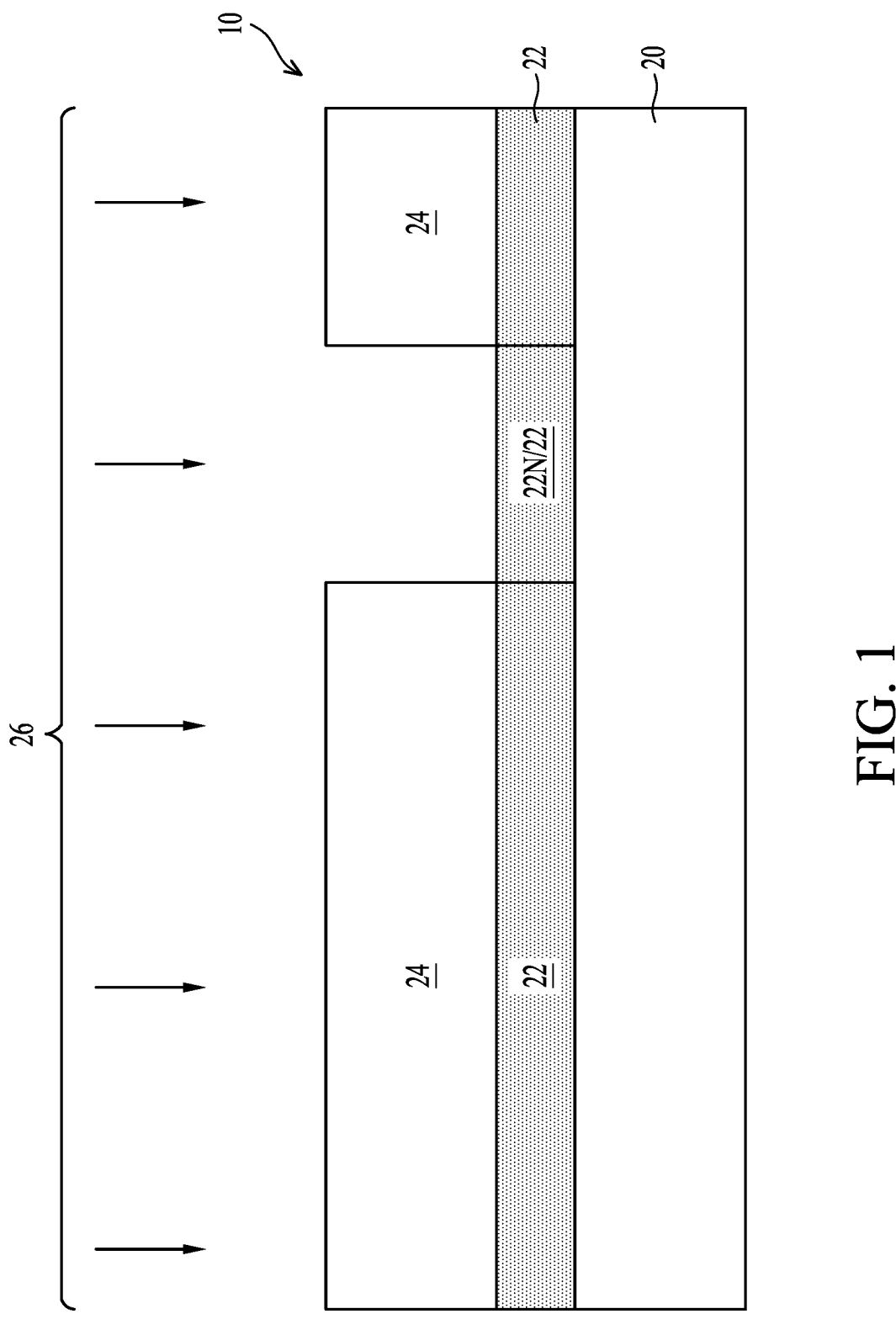
FIGS. 1-17 illustrate the cross-sectional views of intermediate stages in the formation of an inverter formed of double-side powered vertical transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A circuit formed of vertical transistors and the methods of forming the same are provided. The vertical transistors may be vertical Gate-All-Around (GAA) transistors. In accordance with some embodiments, vertical GAA transistors are formed, and both of VDD and VSS power lines are formed on the front side and the backside of the vertical transistors. Accordingly, the chip areas occupied by the vertical transistors are reduced. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 17 illustrate the cross-sectional views of intermediate stages in the formation of an inverter comprising double-side powered vertical transistors in accordance with some embodiments of the present disclosure. The corresponding processes are also reflected schematically in the process flow shown in FIG. 22.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity, or may be undoped.

In accordance with some embodiments, epitaxy layer 22 is deposited on substrate 20 through an epitaxy process. Epitaxy layer 22 may be formed of or comprise silicon, silicon germanium, or the like. During the epitaxy process, an in-situ doping process may be performed to dope an n-type dopant or a p-type dopant. The n-type dopant may comprise phosphorous, arsenic, antimony, or the like. The p-type dopant may comprise boron, indium, or the like. The n-type or p-type dopant concentration is selected so that the resulting epitaxy layer 22 may act as a well region of some of the respective vertical transistors. For example, the dopant concentration may be less than $10^{18}$ cm$^{-3}$, such as in the range between about $10^{15}$ cm$^{-3}$ and about $10^{18}$ cm$^{-3}$. In the illustrative example, a p-type dopant is in-situ doped, so that epitaxy layer 22 is of p-type.

Next, an implantation mask such as photoresist 24 is formed and patterned, exposing a portion of epitaxy layer 22. Implantation process 26 is then performed to implant the exposed portion of epitaxy layer 22, so that the conductivity type of the implanted portion is inverted. For example, when epitaxy layer 22 is of p-type, the implanted portion is converted to n-type, and is denoted as portion 22N. Conversely, when epitaxy layer 22 is of n-type, the implanted portion is converted to p-type.

Figure 2:
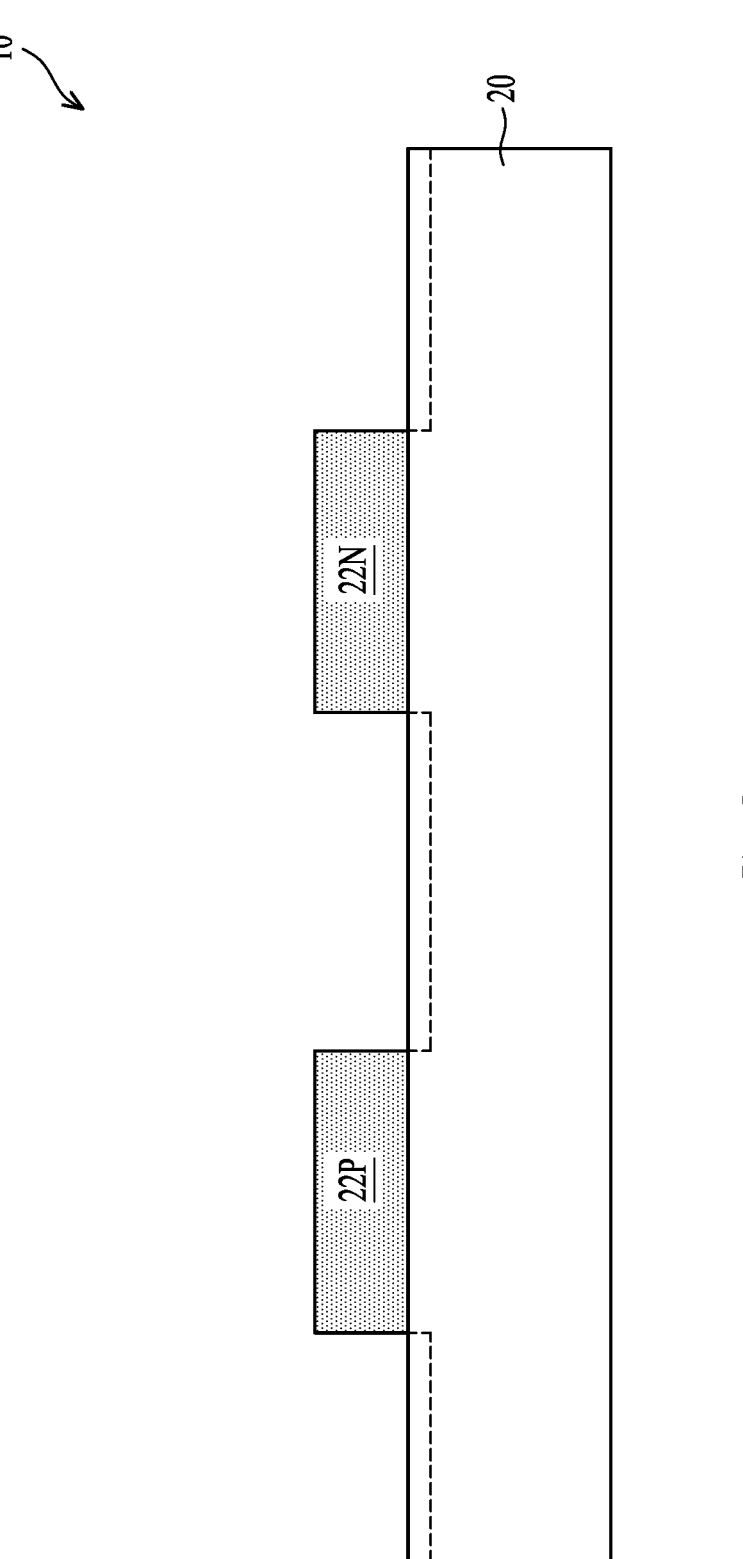
Figure 22:
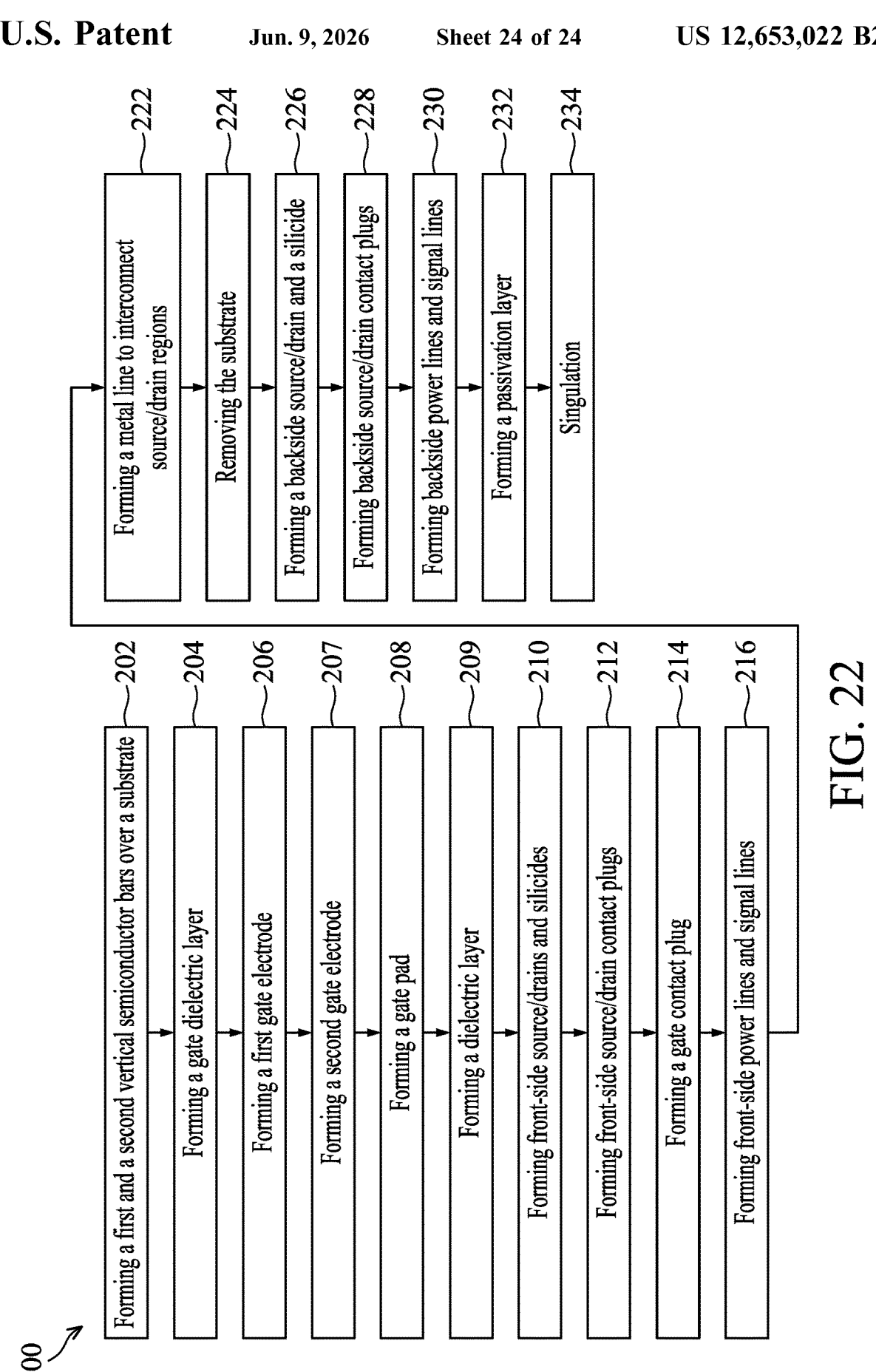
FIG. 22 illustrates a process flow for forming an inverter comprising double-side powered vertical transistors in accordance with some embodiments.

Next, referring to FIG. 2, a patterning process is performed through an etching process, so that the remaining epitaxy layer 22 includes portions 22P and 22N, respectively, which are of p-type and n-type, respectively. The respective process is illustrated as process 202 in the process flow 200 as shown in FIG. 22. FIG. 18A illustrates a top view of portions 22N and 22P as an example. In accordance with some embodiments, as shown in FIG. 18A, portions 22P and 22N are elongated strips to increase channel length. In accordance with other embodiments, portions 22P and 22N may have other shapes such as rectangular or circular top-view shapes. For example, each of portions 22P and 22N may include a plurality of small discrete portions that are separated from each other, and the discrete portions may be arranged with a periodic pattern such as an array.

In accordance with some embodiments, the patterning is stopped on the top surface of substrate 20. In accordance with other embodiments, a top surface portion of substrate 20 is also patterned and recessed, and the resulting recessed top surfaces of substrate 20 are illustrated using dashed lines. Throughout the description, portions 22P and 22N are alternatively referred to as vertical semiconductor bars 22P and 22N.

In above-illustrated embodiments, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
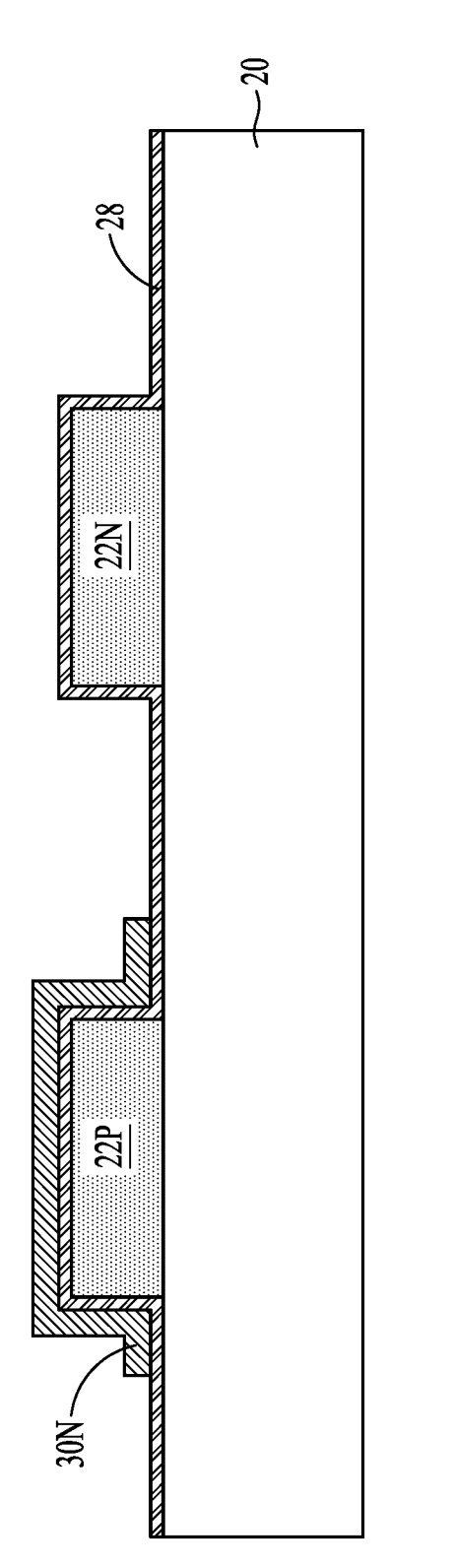

Referring to FIG. 3, gate dielectric layer 28 is formed. The respective process is illustrated as process 204 in the process flow 200 as shown in FIG. 22. In accordance with some embodiments, gate dielectric layer 28 includes an Interfacial Layer (IL) in contact with vertical semiconductor bars 22P and 22N, and a high-k dielectric layer over the IL. In accordance with some embodiments, the IL is formed of or comprise silicon oxide, which may be formed through a deposition process, and/or an oxidation process. In the oxidation process, a surface layer of each of vertical semiconductor bars 22N and 22P is oxidized to form an oxide. The high-k dielectric layer may be formed of or comprise hafnium oxide, zirconium oxide, aluminum oxide, lanthnum oxide, or the like. The high-k dielectric layer (and possibly the IL also) may be formed as being a conformal layer(s), for example, deposited using Atomic Layer Deposition (ALD), Chemical Vapor Deposition (CVD), or the like.

FIG. 3 also illustrates the formation of gate electrode 30N. The respective process is illustrated as process 206 in the process flow 200 as shown in FIG. 22. In accordance with some embodiments, the formation of gate electrode 30N includes depositing one or a plurality of conductive layers sequentially, and then patterning the plurality of conductive layers. The deposited layers may include an n-type work function layer (when the respective underlying vertical semiconductor bar is of p-type). In addition, the deposited layers may also include adhesion layers, capping layers (such as TiN layers), and/or the like. In accordance with some embodiments, the n-type work function layer may comprise titanium aluminum (TiAl), TiAlN, or the like. After the deposition, an etching process(es) may be performed to pattern the deposited layers, leaving gate electrode 30N.

Figure 4:
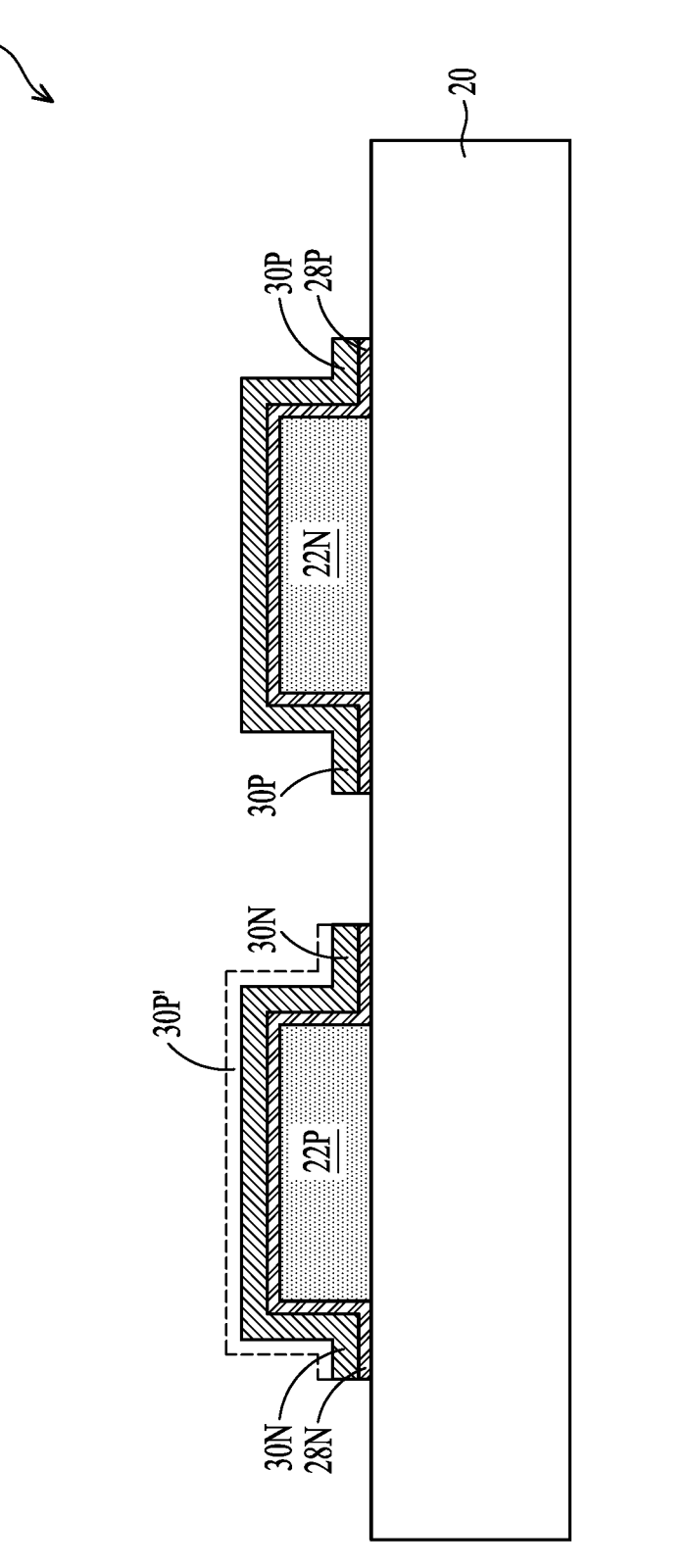

FIG. 4 illustrates the formation of gate electrode 30P. The respective process is illustrated as process 208 in the process flow 200 as shown in FIG. 22. In accordance with some embodiments, the formation of gate electrode 30P also includes depositing one or a plurality of layers sequentially, and then patterning the plurality of layers. The deposited layers may include a p-type work function layer, and possibly adhesion layers, capping layers (such as TiN layers), and/or the like. In accordance with some embodiments, the p-type work function layer may comprise a TiN layer and possibly a TaN layer. After the deposition, an etching process(es) may be performed to pattern the deposited layers, leaving gate electrode 30P.

In accordance with some embodiments, the portion of the p-type work function layer overlapping n-type gate electrode 30N may be removed, resulting in the structure shown in FIG. 4. In accordance with alternatively embodiments, the portion 30P' of the p-type work function layer overlapping n-type work function layer 30N may remain, as shown by dashed lines in FIG. 4.

Figure 13:
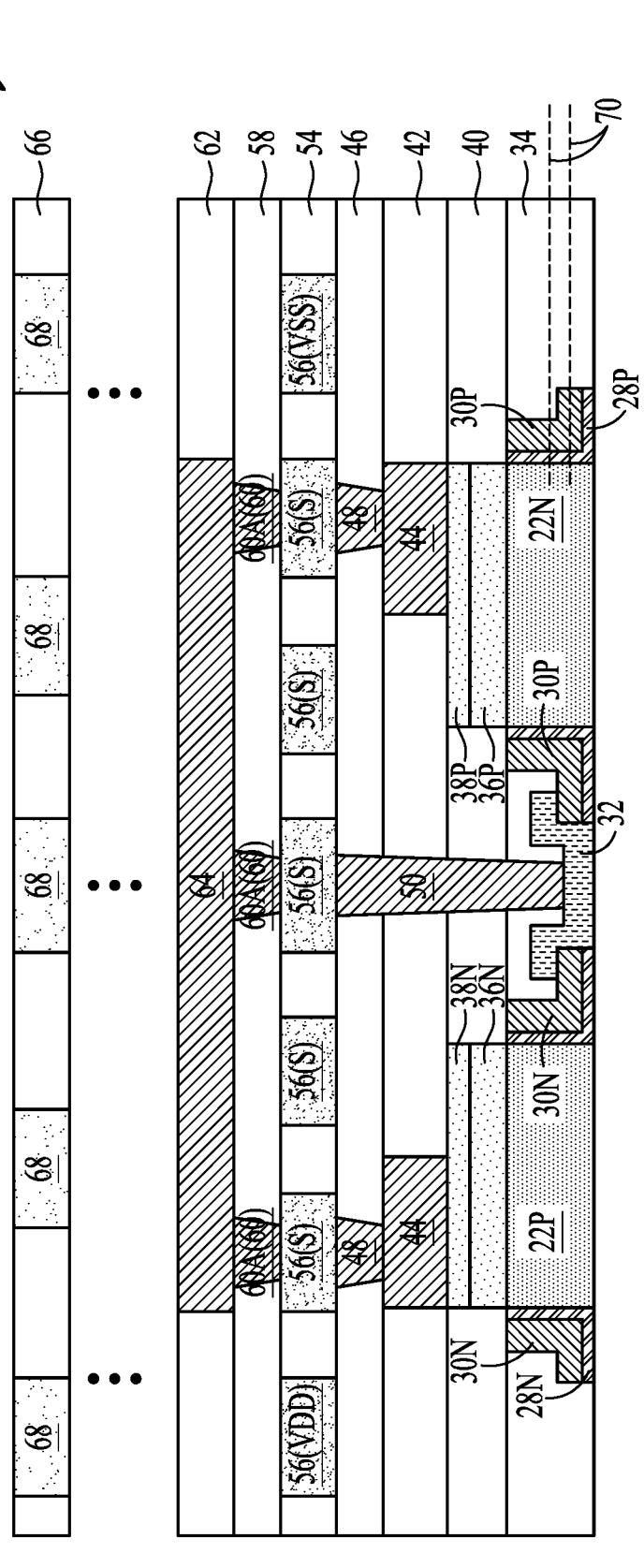

In accordance with some embodiments, gate dielectric layer 28 is patterned, and some horizontal portions of gate dielectric layer 28 are removed. The remaining portions of gate dielectric layer 28 surrounding vertical semiconductor bars 22N and 22P are referred to as gate dielectrics 28N and 28P, respectively. In accordance with alternative embodiments, gate dielectric layer 28 is not patterned, and remain as being a blanket layer. The horizontal portions of gate dielectric layer 28 may then be removed in the subsequent backside grinding process, as shown in FIG. 13.

Figure 5:
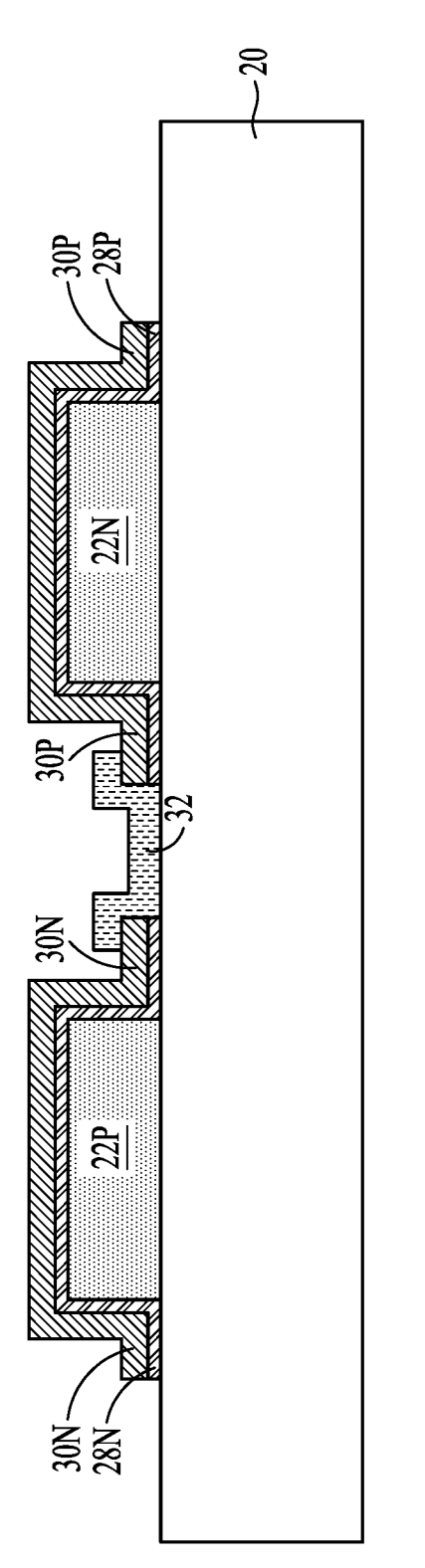

FIG. 5 illustrates the formation of gate pad 32, which is used for landing a gate contact plug. The respective process is illustrated as process 210 in the process flow 200 as shown in FIG. 22. The formation of gate pad 32 may also include depositing a metal layer such as a copper layer, an aluminum layer, a tungsten layer, or the like, and patterning the metal layer. In accordance with some embodiments, gate pad 32 is in contact with gate electrode 30N and 30P, and electrically connects gate electrode 30N to gate electrode 30P.

Figure 6:
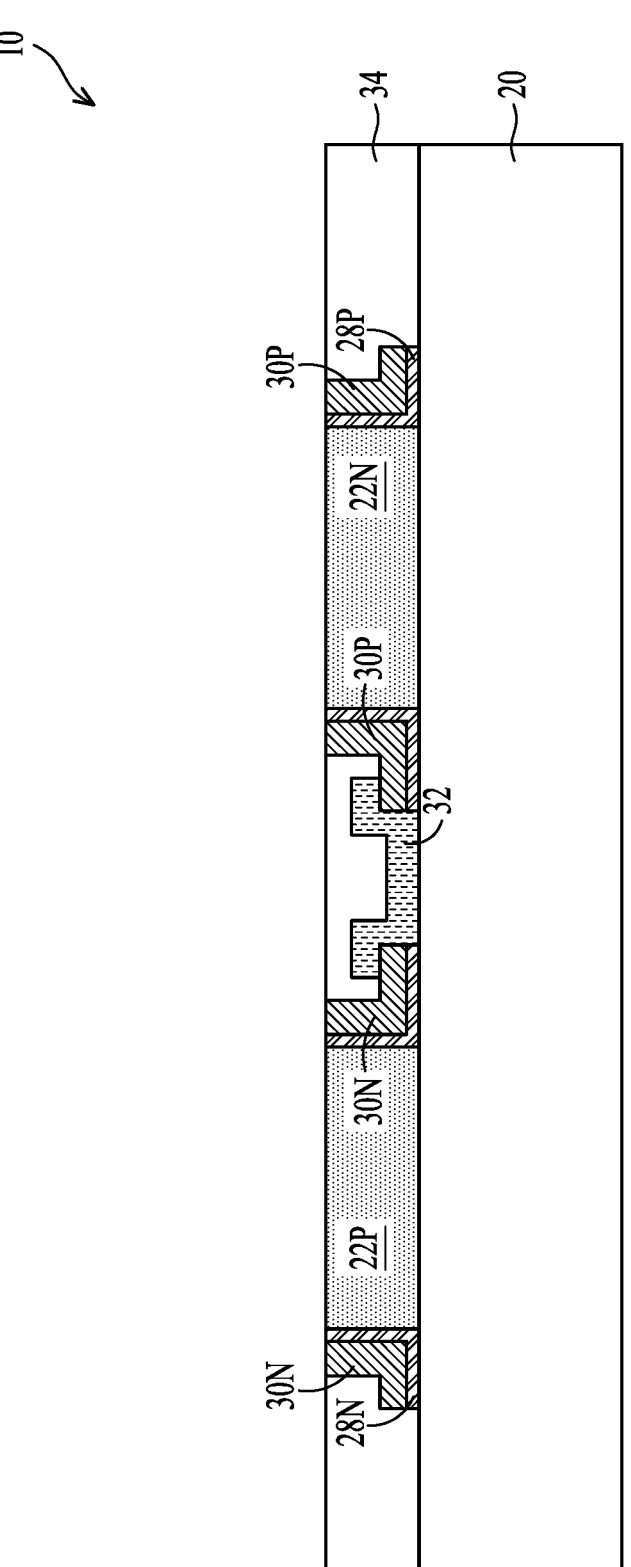

FIG. 6 illustrates the formation of dielectric layer 34 to embed vertical semiconductor bars 22P and 22N, gate dielectrics 28N and 28P, gate electrodes 30N and 30P, and gate pad 32 therein. The respective process is illustrated as process 212 in the process flow 200 as shown in FIG. 22. Dielectric layer 34 may be a homogeneous dielectric layer, or may include a Contact Etch Stop Layer (CESL, which is conformal) and an Inter-Layer Dielectric (ILD). The CESL may be formed of silicon oxide, silicon nitride, silicon carbo-nitride, or the like, and may be formed using CVD, ALD, or the like. The ILD may include a dielectric material formed using, for example, FCVD, spin-on coating, CVD. ALD, or another deposition method. The ILD may be formed of an oxygen-containing dielectric material, which may be a silicon-oxide based material such as silicon oxide, Phospho-Silicate Glass (PSG), Boro-Silicate Glass (BSG), Boron-Doped Phospho-Silicate Glass (BPSG), or the like.

Next, a planarization process such as a Chemical Mechanical Polish (CMP) process or a mechanical grinding process may be performed to remove some portions of dielectric layer 34, gate dielectrics 28N and 28P, and gate electrodes 30N and 30P, with the removed portions being higher than vertical semiconductor bars 22P and 22N. Accordingly, the top surfaces of vertical semiconductor bars 22P and 22N are revealed.

Figure 7:
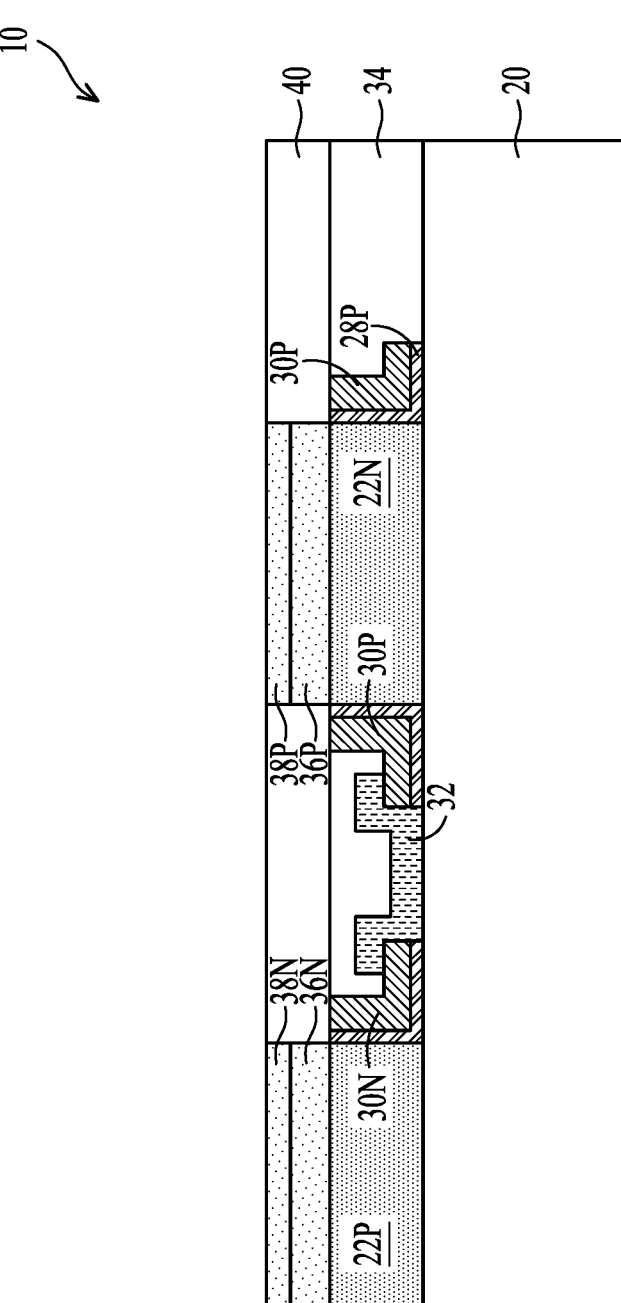

FIG. 7 illustrates the formation of epitaxy layers 36N and 36P, which form the front-side source/drain regions of the resulting vertical transistors, and may have single crystalline structures. The respective process is illustrated as process 214 in the process flow 200 as shown in FIG. 22. Throughout the description, source/drain region(s) may refer to a source or a drain, individually or collectively dependent upon the context. Epitaxy layers 36N and 36P are formed through selective epitaxy processes, so that they are selectively grown from the top surfaces of vertical semiconductor bars 22P and 22N, respectively, but not from dielectric materials and metals. Epitaxy layers 36N and 36P may be heavily doped (for example, through in-situ doping during the epitaxy), so that epitaxy layers 36N and 36P are N+ layer and P+ layer, respectively. For example, the doping concentration of epitaxy layers 36N and 36P may be in the range between about $5E20/cm^3$ and about $5E22/cm^3$. Epitaxy layers 36N and 36P are selective grown in separate epitaxy processes, with dielectric hard masks (not shown) being used to mask the regions in which the epitaxy is not intended.

Since the epitaxy process is selective, and epitaxy layers 36N and 36P are not grown from dielectric layers and metal layers, epitaxy layers 36N and 36P are self-aligned to the underlying vertical semiconductor bars 22P and 22N, respectively.

FIG. 7 also illustrates a silicidation process for forming silicide layers 38N and 38P. The respective process is also illustrated as process 214 in the process flow 200 as shown in FIG. 22. The formation process may include depositing a metal layer such as a nickel layer, a cobalt layer, or the like, performing an annealing process(es) to react the metal layer with a surface portion of each of epitaxy layers 36N and 36P, so that silicide layers 38N and 38P are formed. After the silicidation process, unreacted portions of the metal layer are removed through etching, leaving silicide layers 38N and 38P. Although not shown, silicide layers 38N and 38P may extend to the sidewalls of the remaining epitaxy layers 36N and 36P, respectively. Since the silicidation process is also selective, silicide layers 38N and 38P are self-aligned to the underlying epitaxy layers 36N and 36P, respectively.

ILD 40 is also formed. In accordance with some embodiments, the formation of ILD 40 may comprise depositing a dielectric layer, and performing a CMP process, until the top surfaces of silicide layers 38N and 38P are exposed. In accordance with alternative embodiments, ILD 40 is formed first, followed by patterning ILD 40 to reveal vertical semiconductor bars 22P and 22N. The selective epitaxy processes are then performed to form epitaxy layers 36N and 36P, followed by a silicidation process to form silicide layers 38N and 38P.

ILD 40 may be a homogeneous dielectric layer formed of a homogeneous dielectric material such as silicon oxide, PSG, BSG, BPSG, or the like. Alternatively, ILD 40 may comprise a conformal CESL, and a ILD over the CESL.

Figure 8:
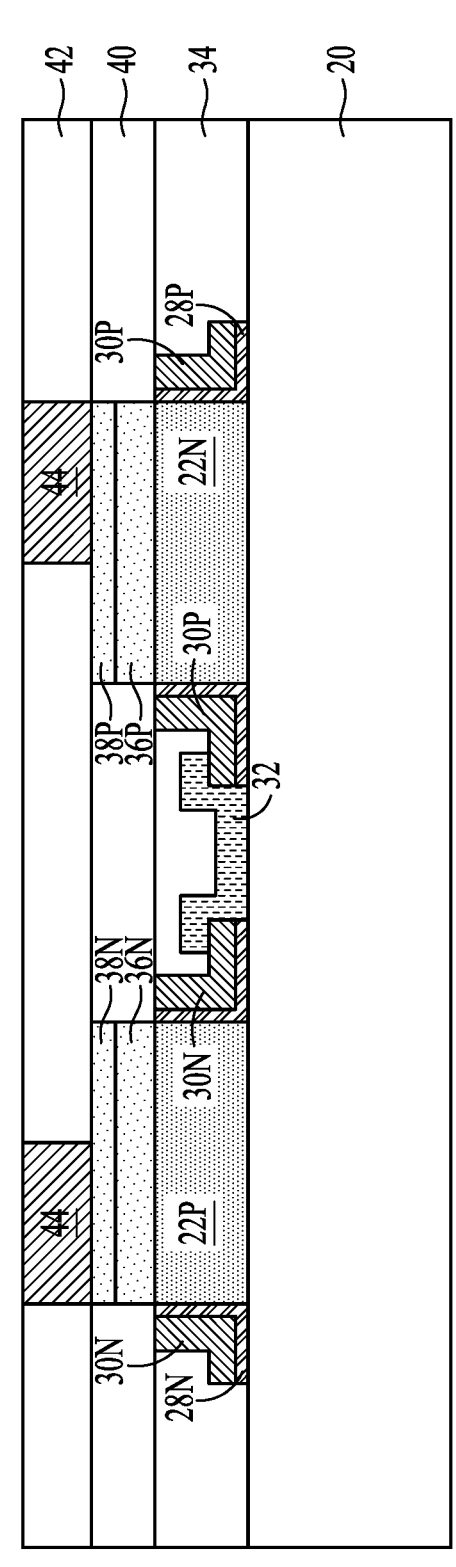

FIG. 8 illustrates the formation of ILD 42. Front-side source/drain contact plugs 44 are also formed. The respective process is illustrated as process 216 in the process flow 200 as shown in FIG. 22. There may be an etch stop layer (not shown) formed before the formation of ILD 42. In accordance with some embodiments, the formation of ILD 42 and source/drain contact plugs 44 includes depositing ILD 42, patterning ILD 42 to form source/drain contact openings and to reveal silicide layers 38N and 38P, filling the source/drain contact openings with metallic-containing materials/layers, and performing a planarization process. Each of source/drain contact plugs 44 may comprise an adhesion layer such as a TiN layer, and a metal region (such as a tungsten region, a cobalt region, or the like) over the adhesion layer.

In accordance with alternative embodiments, instead of forming silicide layers 38N and 38P before the formation of ILD 42, ILD 42 may be formed first. Silicide layers 38N and 38P and source/drain contact plugs 44 are formed after the formation and the patterning of ILD 42 to reveal epitaxy layers 36N and 36P. Accordingly, the edges of source/drain contact plugs 44 are vertically aligned to the edges of the respective underlying silicide layers 38N and 38P. The edges of silicide layers 38N and 38P, however, may be laterally recessed from the respective edges of epitaxy layers 36N and 36P.

Figure 9:
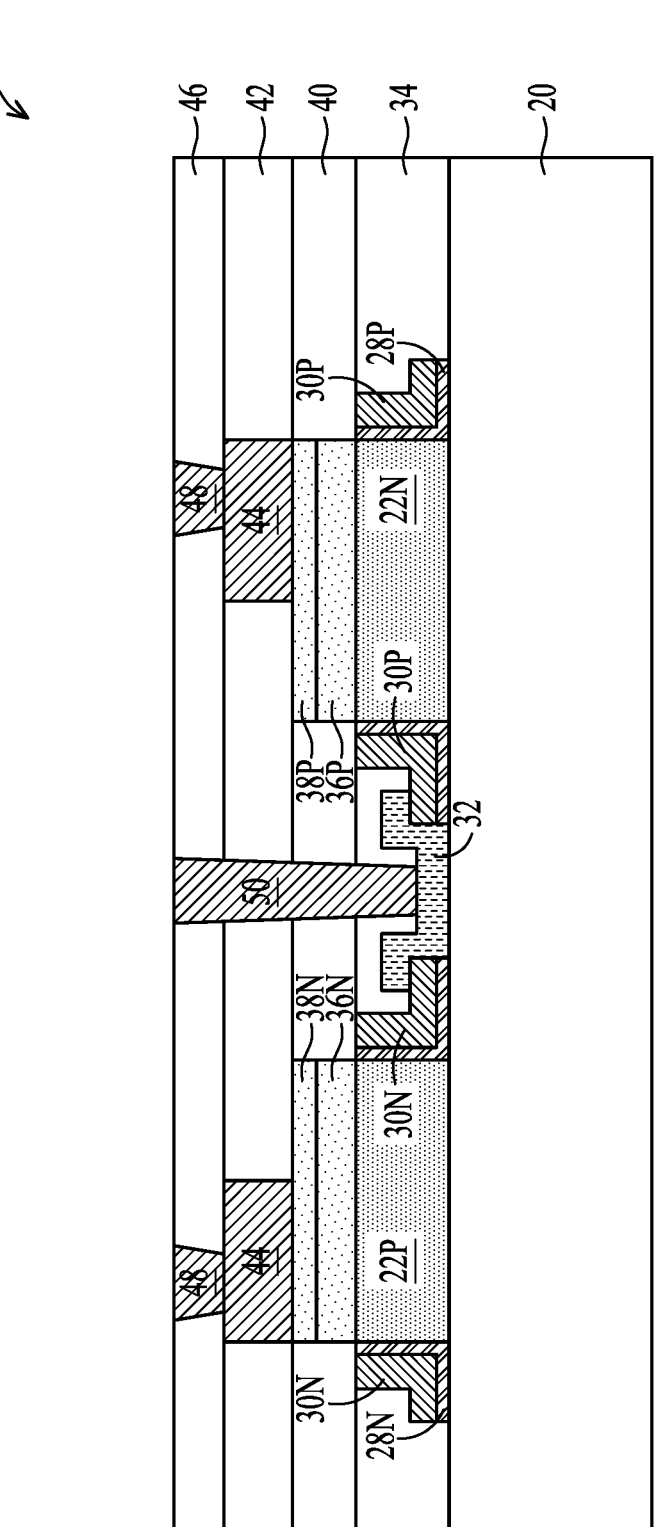

FIG. 9 illustrates the formation of dielectric layer 46, vias 48, and gate contact plugs 50. There may also be an etch stop layer (not shown) formed before the formation of dielectric layer 46. In accordance with some embodiments, the formation of dielectric layer 46 and vias 48 includes depositing dielectric layer 46, patterning dielectric layer 46 to form via openings and to reveal source/drain contact plugs 44, filling the vias openings with metallic-containing materials/layers, and performing a planarization process. Dielectric layer 46 may comprise a carbon-containing low-k dielectric material. Each of vias 48 may comprise a diffusion barrier (such as a TiN layer), and a copper-containing region over the diffusion barrier.

Gate contact plug 50 is also formed. The respective process is illustrated as process 218 in the process flow 200 as shown in FIG. 22. The formation process may include etching dielectric layers 46 and ILDs 42, 40, and 34 to form a gate contact opening, and then filling the gate contact opening with a metal-containing material. Gate contact plug 50 may comprise an adhesion layer such as a TiN layer, and a metal region (such as a tungsten region, a cobalt region, or the like) over the adhesion layer.

Figure 10:
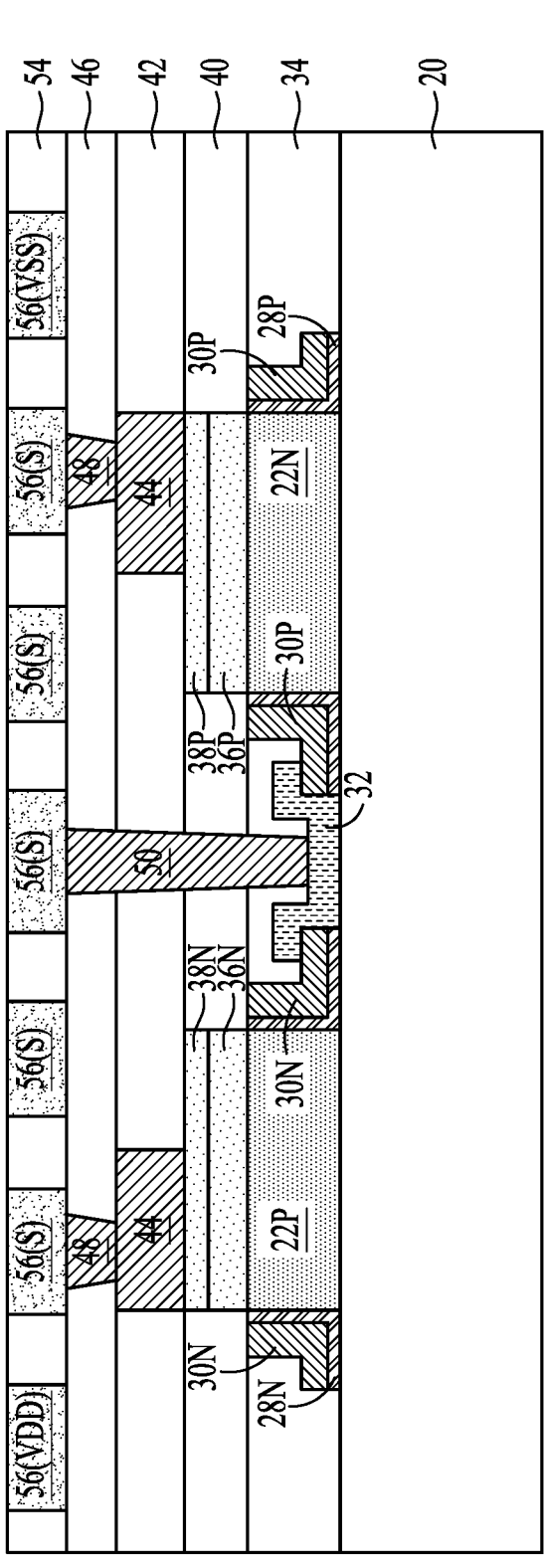

FIG. 10 illustrates the formation of dielectric layer 54 and metal lines 56. There may also be an etch stop layer (not shown) formed before the formation of dielectric layer 54. Dielectric layer 54 may comprise a carbon-containing low-k dielectric material. Metal lines 56 may include power lines 56(VDD) and 56(VSS) and signal lines 56(S). Metal lines 56 may be collectively referred to as metal layer M0. The formation process and the materials of dielectric layer 54 and metal lines 56 may comprise a damascene process, and may be essentially the same as that of dielectric layer 46 and metal vias 48, respectively.

Figure 11:
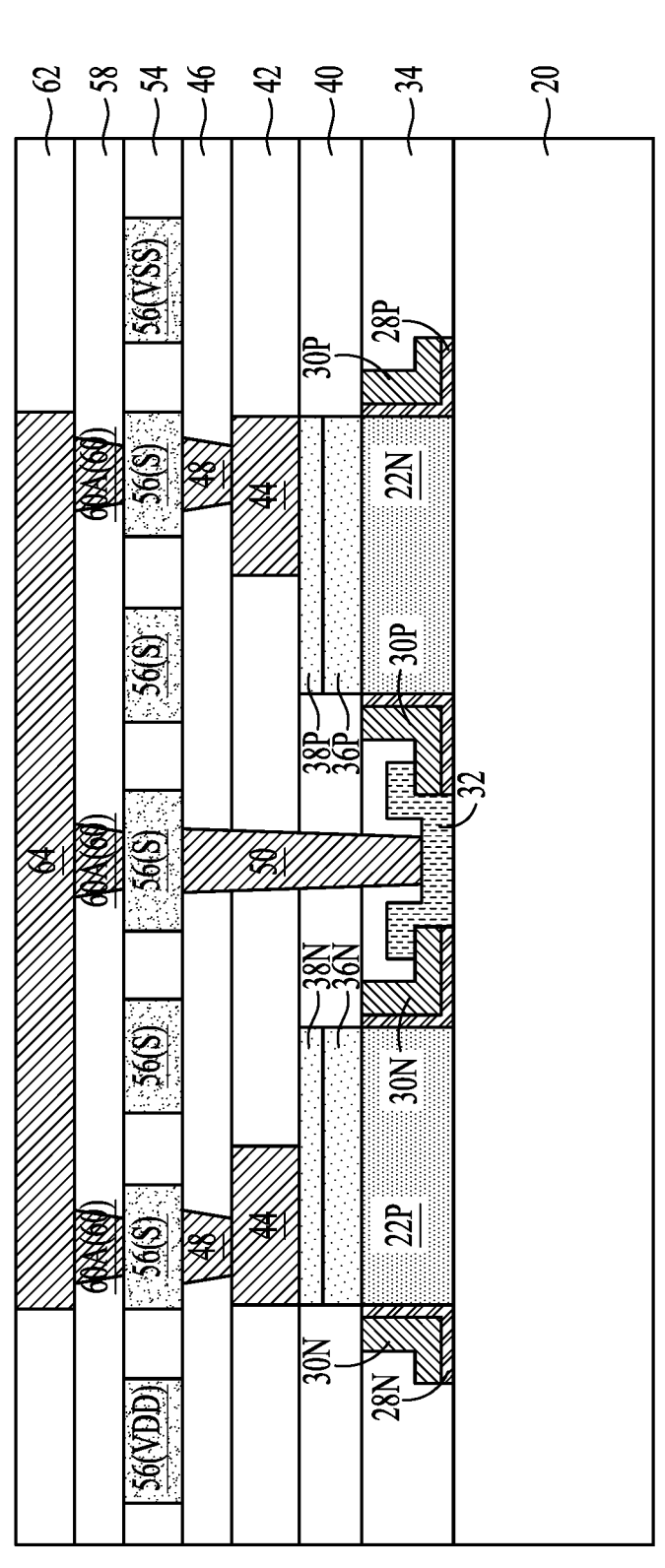

FIG. 11 illustrates the formation of dielectric layers 58 and 62 and vias 60. Vias 60 are collectively referred to as vias Via0. Dielectric layers 58 and 62 may comprise a carbon-containing low-k dielectric material(s). The formation process and the materials of dielectric layers 58 and 62 and vias 60 may be essentially the same as that of dielectric layer 54 and metal lines 56, respectively.

Metal lines 64 is also formed. Metal lines 64 are collectively referred to as metal layer M1. The respective process is illustrated as process 222 in the process flow 200 as shown in FIG. 22. In accordance with some embodiments, a metal line 64 electrically connects two vias 60A, which are further electrically connected to the source/drain regions of two vertical transistors in the inverter. Via 60B is also illustrated as being dashed since via 60B is in a different plane than illustrated, and is not connected to the illustrated metal line 64. Furthermore, vias 60 and metal lines 64 may be formed through two single damascene processes or a dual damascene process.

Figure 12:
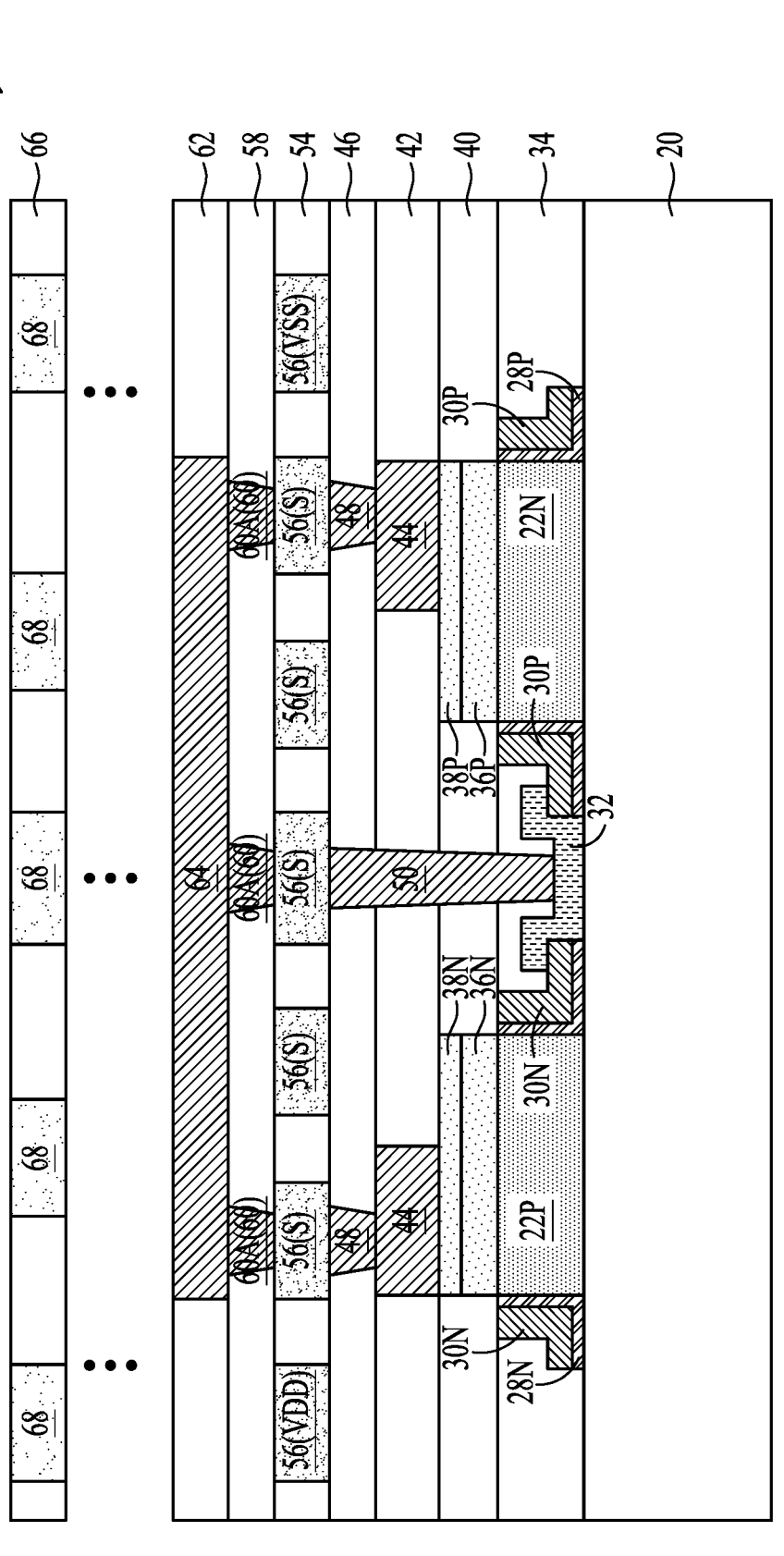

FIG. 12 illustrates the formation of more dielectric layers, metal vias, metal lines, and the like. In accordance with some embodiments, a surface dielectric layer 66 and bond pads 68 are also formed as top surface features of wafer 10. In accordance with alternative embodiments, solder regions may be formed as the top surface features of wafer 10.

FIGS. 13-17 illustrate the formation of backside structures on the backside of vertical semiconductor bars 22P and 22N. A backside grinding process is first performed to remove substrate 20 and to reveal vertical semiconductor bars 22N and 22P. The resulting structure is shown in FIG. 13. The respective process is illustrated as process 224 in the process flow 200 as shown in FIG. 22. A carrier (such as a glass carrier, not shown) may be attached to the front side of wafer 10 before the backside grinding process is performed. As a result of the backside grinding process, the back surfaces of vertical semiconductor bars 22P and 22N are revealed.

In accordance with some embodiments, the horizontal portions of gate dielectrics 28N and 28P remain after the backside grinding process. In accordance with alternative embodiments, the horizontal portions of gate dielectrics 28N and 28P are also removed by the backside grinding process. For example, dashed lines 70 illustrate the possible levels of the backside surfaces of vertical semiconductor bars 22P and 22N in accordance with alternative embodiments.

Figure 14:
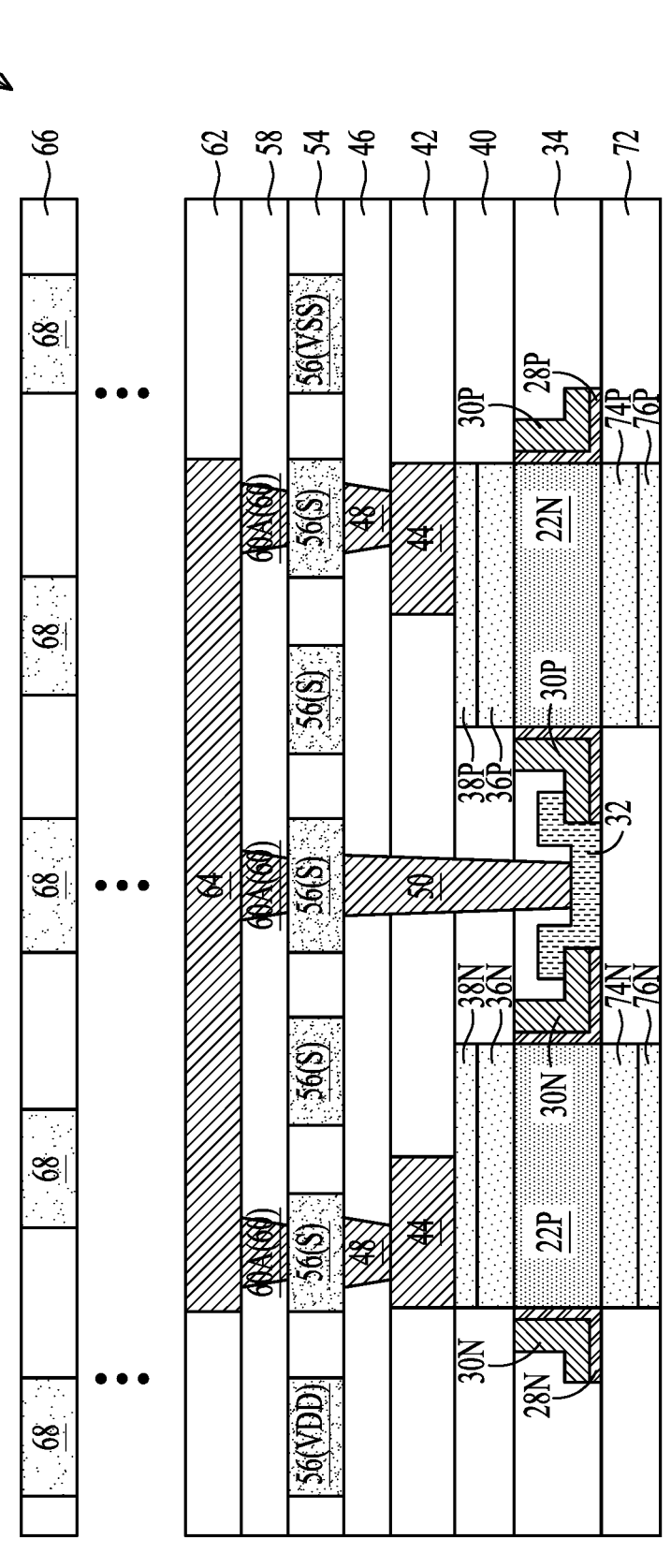

FIG. 14 illustrates the formation of dielectric layer 72, epitaxy regions 74N and 74P, and silicide layers 76N and 76P. The respective process is illustrated as process 226 in the process flow 200 as shown in FIG. 22. The materials, structures, and formation processes may be essentially the same as that of ILD 40, epitaxy regions 36N and 36P, and silicide layers 38N and 38P, respectively. The details are thus not repeated herein.

Figure 15:
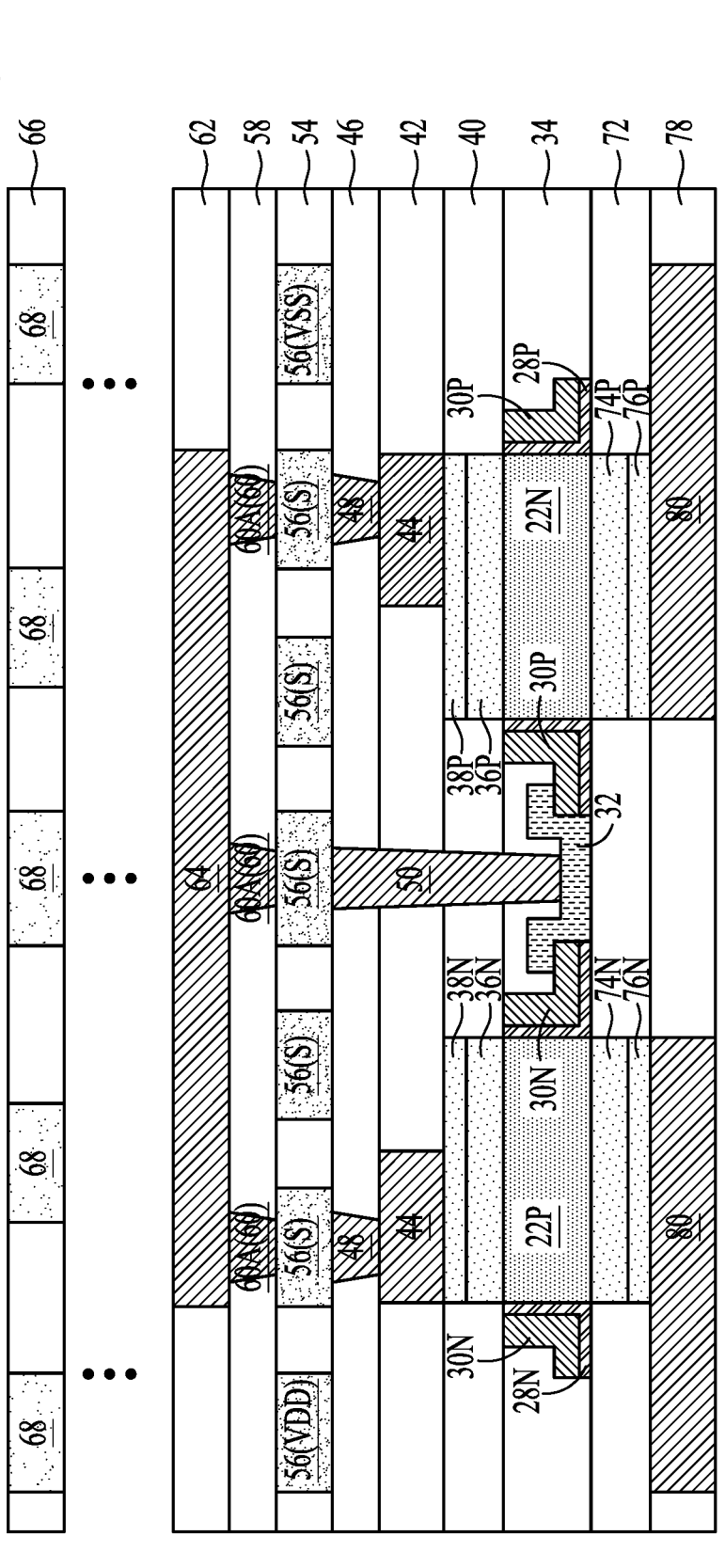

FIG. 15 illustrates the formation of dielectric layer 78. Contact plugs 80 are also formed. The respective process is illustrated as process 228 in the process flow 200 as shown in FIG. 22. The materials, structures, and formation processes may be essentially the same as that of dielectric layer 46 and vias 48, respectively. The details are thus not repeated herein. Contact plugs 80 may be routed laterally, so that some portions of contact plugs 80 are overlapped by power lines 56(VDD) and 56(VSS).

Figure 16:
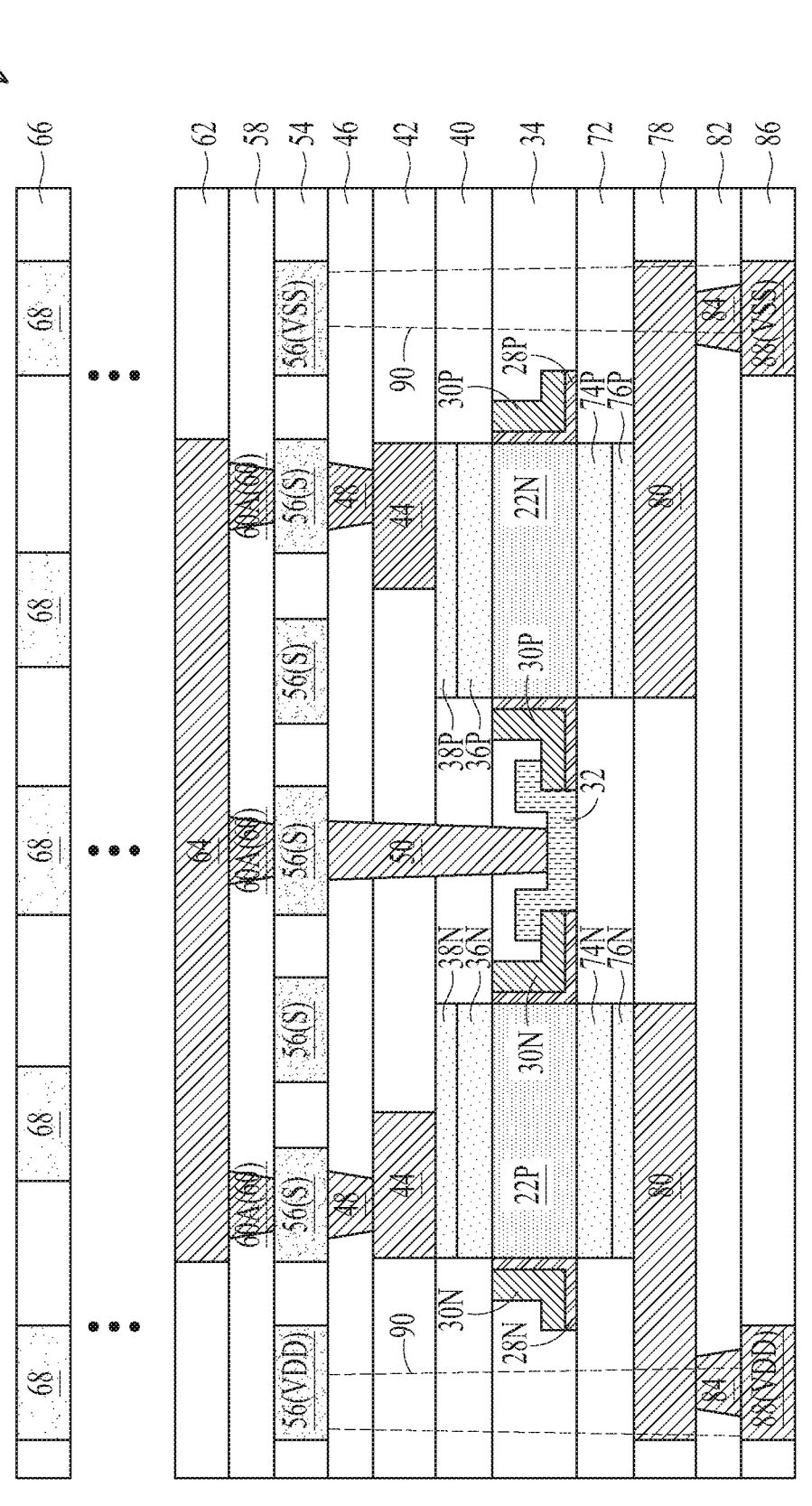

FIG. 16 illustrates the formation of dielectric layers 82 and vias 84. Deep vias 90 are then formed to penetrate a plurality of dielectric layers, and to connect to power lines 56(VDD) and 56(VSS). Deep vias 90 are illustrated as being dashed since they are formed in a plane other than the illustrated plane, and are not in contact with source/drain contact plugs 80 and vias 84.

Next, dielectric layer 86 and backside power lines 88 (including VDD line 88(VDD) and VSS line 88(VSS)) are formed. There may be, or may not be, some signal lines formed in dielectric layer 86. The respective process is illustrated as process 230 in the process flow 200 as shown in FIG. 22. VDD line 88(VDD) and VSS line 88(VSS) are connected to front-side power lines 56(VDD) and 56(VSS), respectively, through deep vias 90. Accordingly, power is conducted from the front-side power lines 56(VDD) and 56(VSS) to backside power lines 88(VDD) and 88(VSS), respectively.

Dielectric layers 82 and 86 may comprise a carbon-containing low-k dielectric material, silicon oxide, or a non-low-k dielectric material such as silicon nitride, silicon carbide, or the like. The formation process and the materials of dielectric layers 82 and 86, vias 84 and backside power lines 88 may be essentially the same as that of dielectric layers 58 and 62, vias 60, and metal line 64 respectively. Furthermore, vias 84 and backside power lines 88 may be formed through single damascene processes or a dual damascene process.

Figure 17:
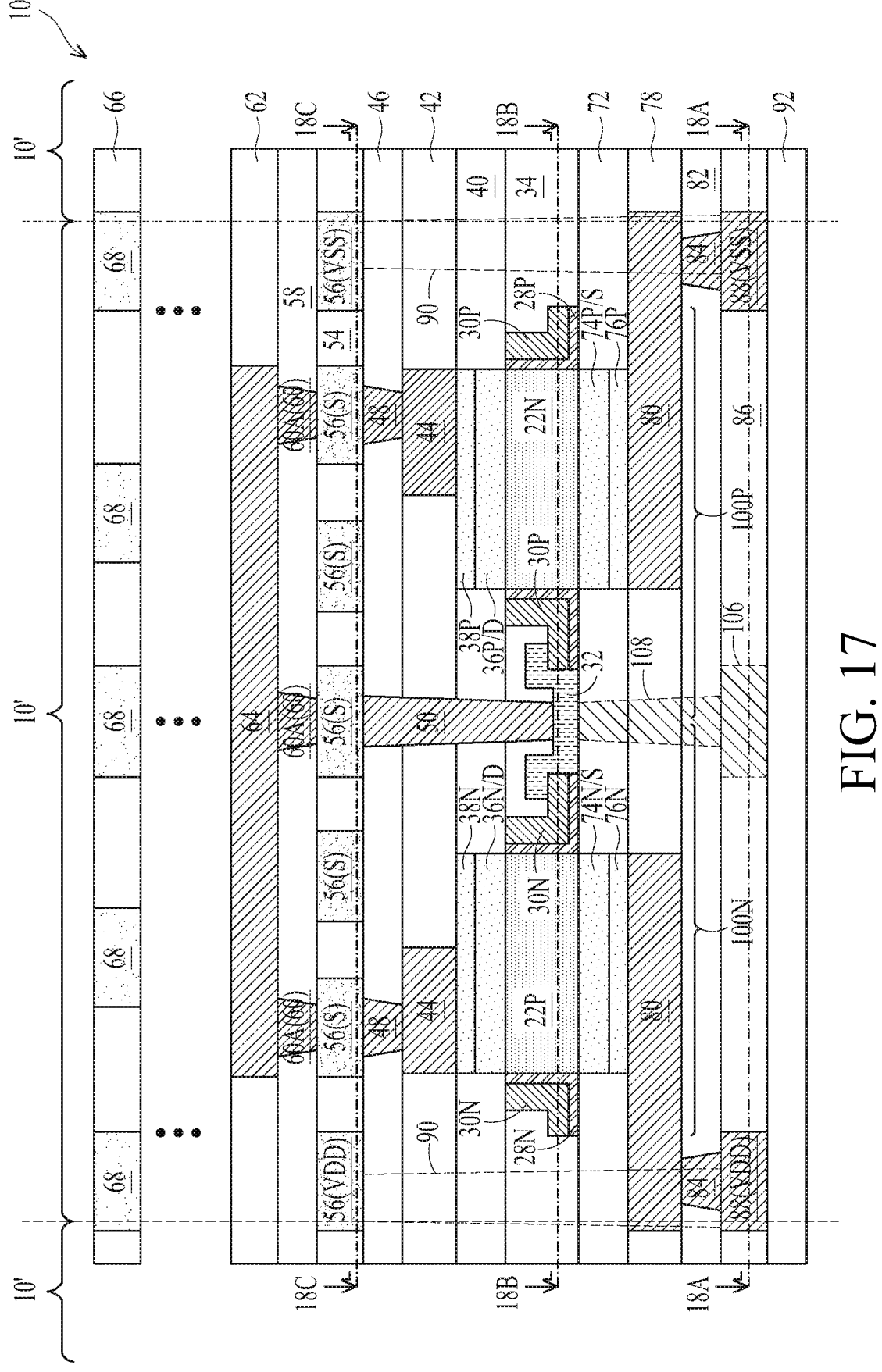

Referring to FIG. 17, passivation layer 92 is formed to protect backside power lines 88. The respective process is illustrated as process 232 in the process flow 200 as shown in FIG. 22. Passivation layer 92 may be formed of a non-low-k and dense dielectric material such as silicon oxide, silicon nitride, un-doped silicate glass, and/or the like, or combinations thereof. Passivation layer 92 may be a blanket layer with no openings and no conductive features therein. Furthermore, there may be no conductive features formed penetrating through passivation layer 92 to connect to backside power lines 88(VDD) and 88(VSS) and signal lines.

In a subsequent process, wafer 10 is singulated, for example, through a sawing process, so that identical device dies 10' are separated from each other. The respective process is illustrated as process 234 in the process flow 200 as shown in FIG. 22. Device die 10' includes vertical transistors 100N and 100P, each having a source region, a channel region, and a drain region aligned to a vertical line. Vertical transistors 100N and 100P are interconnected to form inverter 102. Vertical semiconductor bars 22P and 22N form the channel regions of vertical transistors 100N and 100P, respectively.

Epitaxy region 36N and 74N form the drain region (D) and the source region (S), respectively, of the n-type vertical transistor 100N. Epitaxy region 36P and 74P form the drain region and the source region, respectively, of the p-type vertical transistor 100P. The source region of the vertical transistor 100N is connected to the backside power line 88(VDD). The source region of the vertical transistor 100P is connected to the backside power line 88(VSS). It is appreciated that although in the illustrated example, backside power lines 88(VDD) and 88(VSS) are connected to the source regions of the vertical transistors, the backside power lines may also be connected to drain regions in other circuits.

In accordance with some embodiments, as shown in FIG. 17, the connection to gate pad 32 is achieved from the front side of vertical transistors 100N and 100P through gate contact plug 50. In accordance with alternative embodiments, the connection to the gate electrodes of transistors may be performed from the backside of the vertical transistors. For example, FIG. 17 illustrates backside gate contact plug 108, which is connected to metal line 106. Metal line 106 may be connected to VDD, VSS, or may be a signal line. Front-side gate contact plugs and back-side contact plugs may be used in the same device die to achieve more flexible routing.

FIGS. 18A, 18B, and 18C illustrate the top views obtained at three levels of the structure shown in FIG. 17. The cross-section shown in FIG. 17 include the combination of the features shown in cross-sections 17-17 in FIGS. 18A, 18B, and 18C. FIG. 18A illustrates a top view obtained at cross-section 18A-18A in FIG. 17. In accordance with some embodiments, vertical transistors 100N and 100P are connected to form inverter cell (a standard cell). The boundaries of inverter cell 104 are illustrated. Backside power lines 88(VDD) and 88(VSS) extend from the left boundary to the right boundary of inverter cell 104, and are parallel to each other. Power lines 88(VDD) and 88(VSS) also extend to the top boundary and the bottom boundary, respectively, of inverter cell 104. Vertical semiconductor bars 22N and 22P and backside contact plugs 80 are also illustrated to show the relative positions of these illustrated features, and are illustrated as being dashed since these features are not in the illustrated plane.

FIG. 18B illustrates a top view obtained at cross-section 18B-18B in FIG. 17. In the illustrated plane, gate dielectric 28P and gate electrode 30P encircle vertical semiconductor bar 22N, and gate dielectric 28N and gate electrode 30N encircle vertical semiconductor bar 22P. Accordingly, the respective vertical transistors 100N and 100P are also vertical GAA transistors.

FIG. 18C illustrates a top view obtained at cross-section 18C-18C in FIG. 17. In the illustrated plane, front side power lines 56(VDD) and 56(VSS) extend from the left boundary to the right boundary of inverter cell 104, and are parallel to each other. Power lines 56(VDD) and 56(VSS) also extend to the top boundary and the bottom boundary, respectively, of inverter cell 104. Furthermore, signal metal lines 64 (including 64G and 64D) have lengthwise directions perpendicular to the lengthwise direction of power lines 56(VDD) and 56(VSS). Metal line 64G is connected to the gates of vertical transistors 100N and 100P through via 60B, and is connected to the input of the inverter cell 104. Metal line 64D is connected to two vias 60A, and is connected to the drains of the vertical transistors. Metal line 64D is also connected to vias 48, and may act as the output of inverter cell 104. As shown in FIG. 18C, it is possible to shift the via 60B slightly left, and vias 60A slightly right, so that they are not electrically shorted to each other.

By conducting the front side power lines 56(VDD) and 56(VSS) to the respective backside power lines 88(VDD) and 88(VSS), and connecting the lower source/drain regions to the backside power lines 88(VDD) and 88(VSS), the device cells formed using the vertical transistors may be smaller than if the power lines are only on the font side of the vertical transistors. For example, referring to FIG. 18B, if there are no backside power lines, deep vias may have to be formed at positions 110 in FIG. 18B in order to provide VDD and VSS to the source regions of the vertical transistors. Also, since the drain regions are directly over the vertical semiconductor bars 22N and 22P, the interconnection of the drain regions cannot be achieved using a straight metal line directly interconnecting the drain regions since the straight metal line will be shorted with the gate. Accordingly, the interconnection of the drain regions has to run sideway to the left or right (as schematically illustrated by dashed line 112). The respective inverter cell 104 thus will occupy more chip area. For example, the front-side powered inverters may occur 35 percent more chip area than double-side powered inverters.

Figures 19A, 19B, 19C:
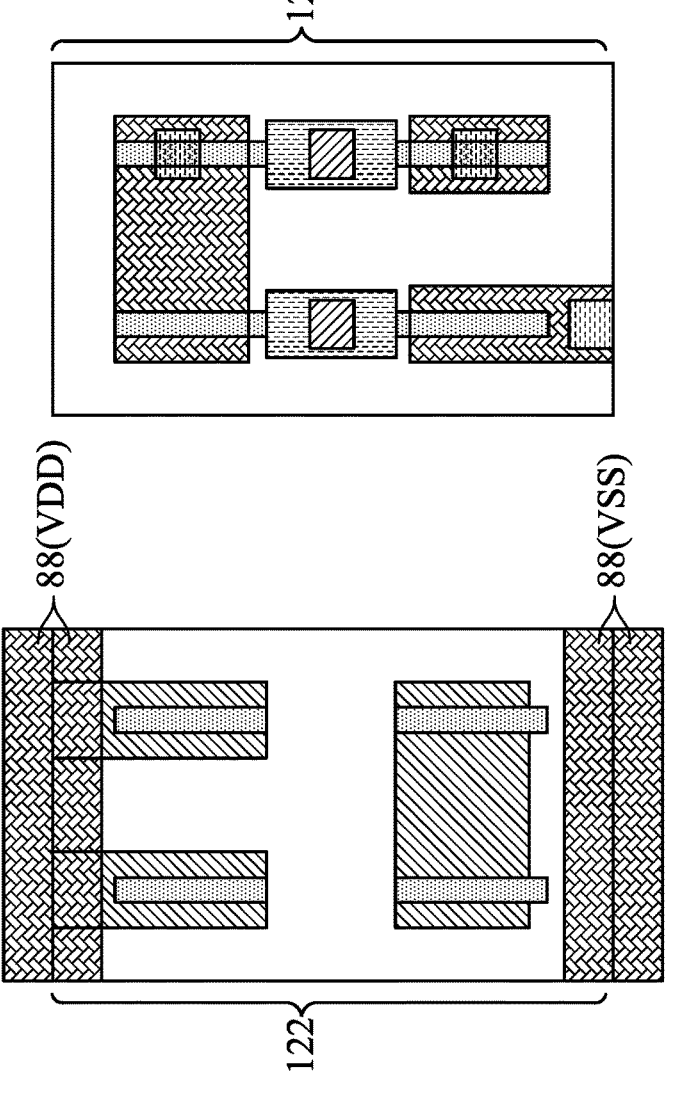
FIGS. 19A, 19B, and 19C illustrate the top views at different levels of a NAND cell comprising double-side powered vertical transistors in accordance with some embodiments.
Figures 20A, 20B, 20C:
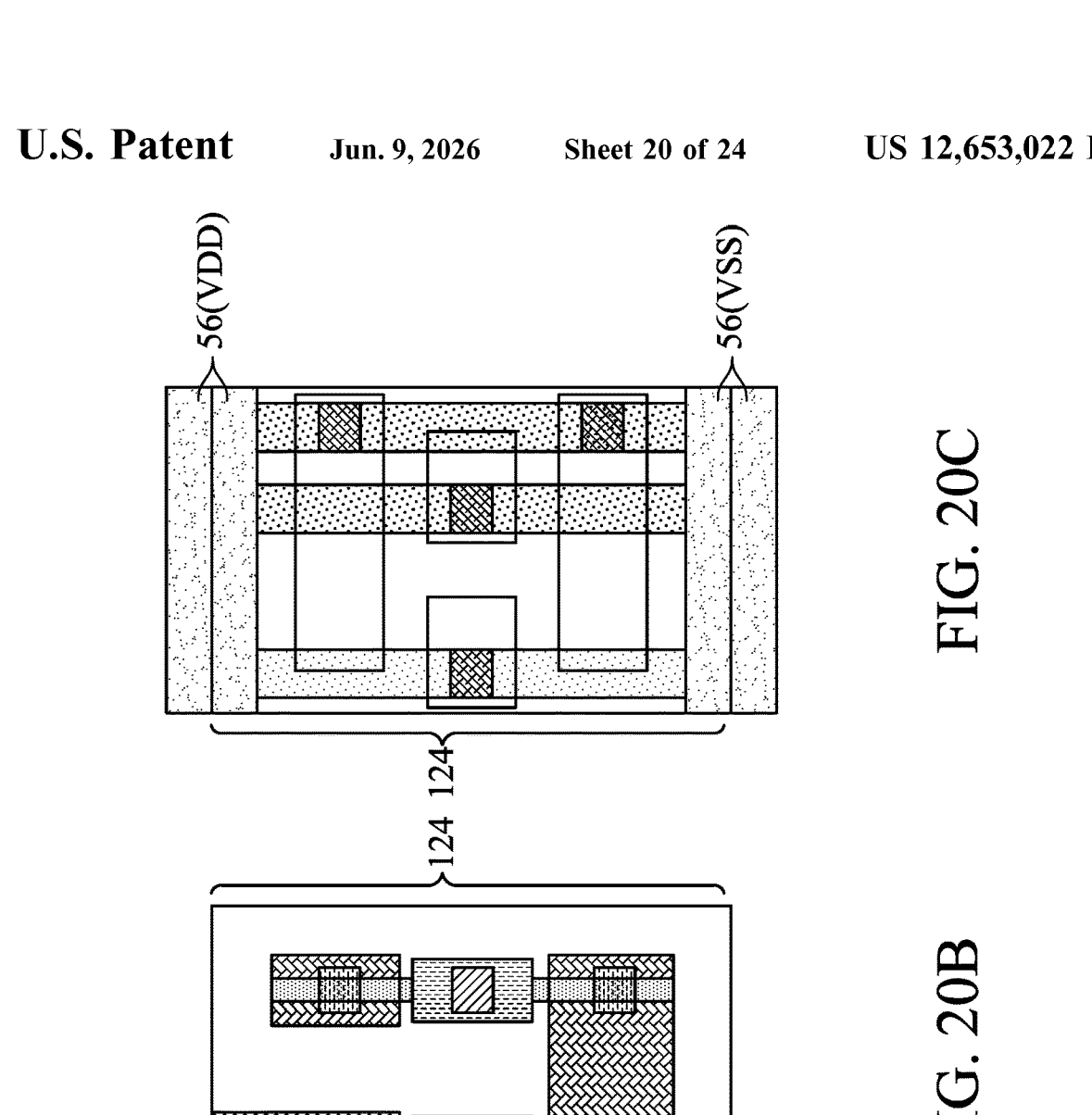
FIGS. 20A, 20B, and 20C illustrate the top views at different levels of a NOR cell comprising double-side powered vertical transistors in accordance with some embodiments.
Figure 21A:
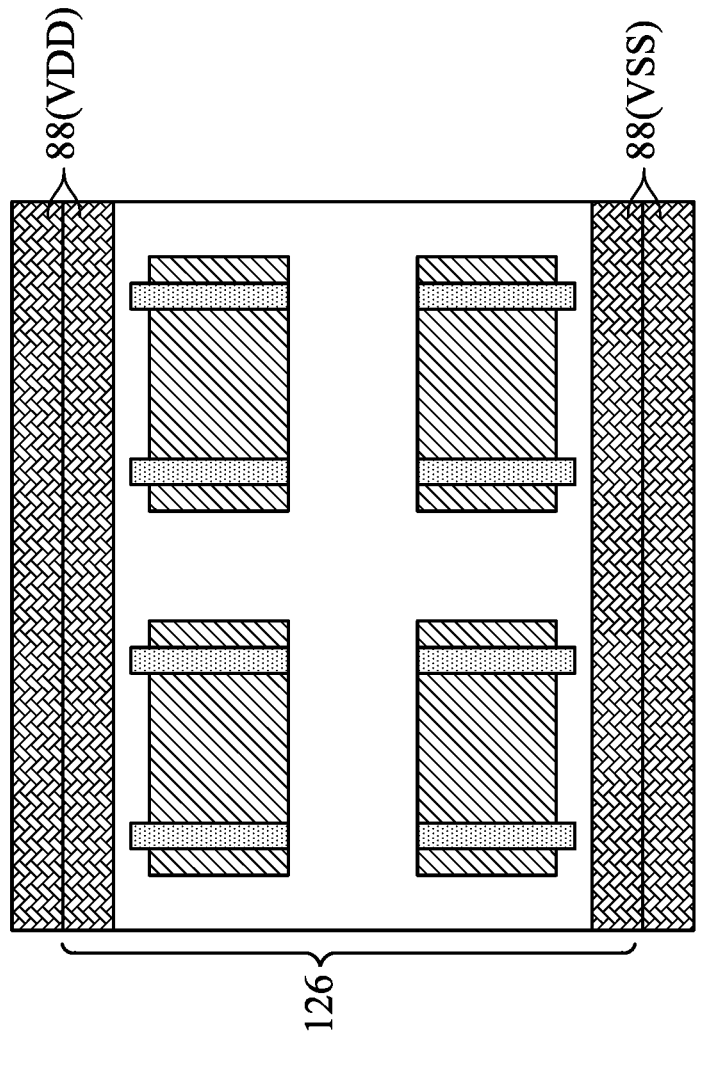
FIGS. 21A, 21B, and 21C illustrate the top views at different levels of a AND-OR-Invert (AOI) cell comprising double-side powered vertical transistors in accordance with some embodiments.
Figure 21B:
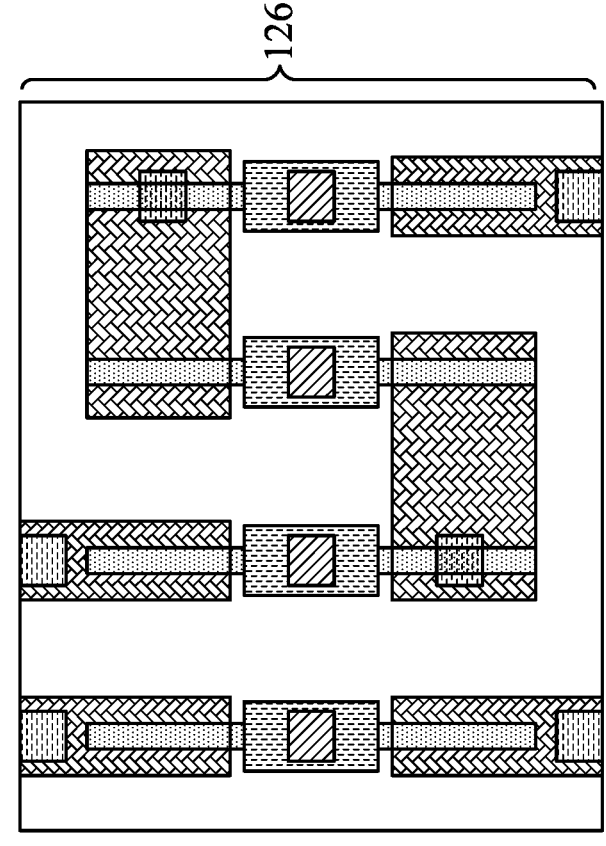
Figure 21C:
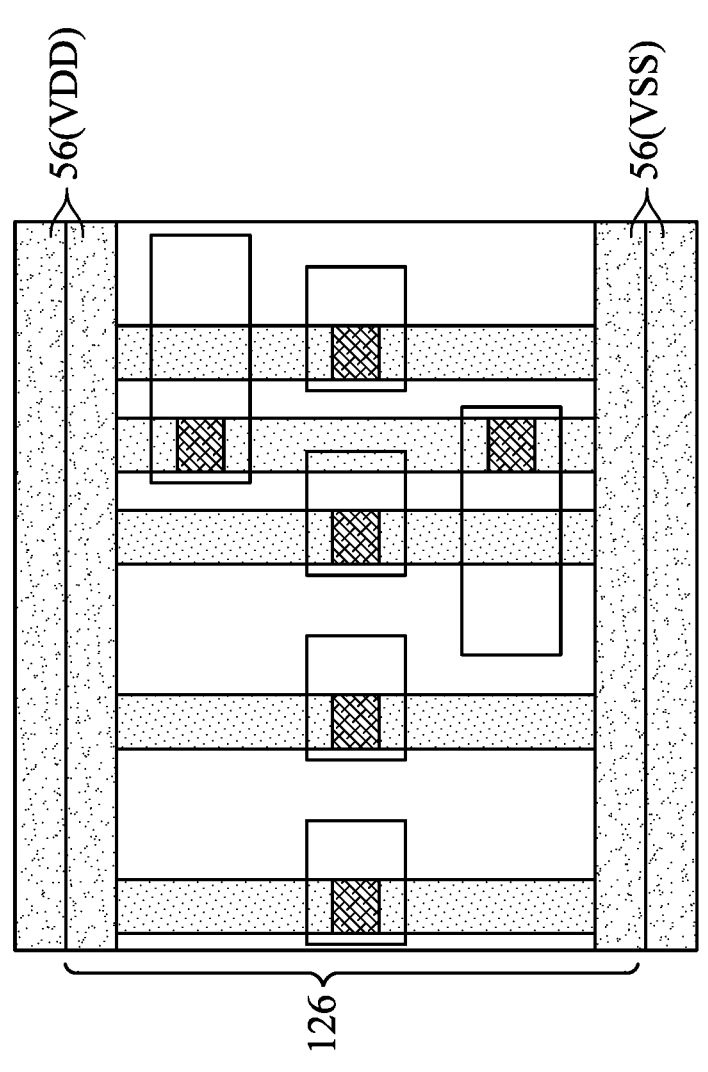

The double-side powered inverters may be stored as a standard cell in a cell library. Also, other standard cells formed of vertical transistors may also occupy smaller chip areas than the respective front-side powered standard cells. Accordingly, these standard cells may also be laid out using double-side powered cells and stored in cell library. For example, FIGS. 19A, 19B, and 19C schematically illustrate a lower level, a middle level, and an upper level of a NAND cell 122, wherein the top views are obtained from the same levels as that of FIGS. 18A, 18B, and 18C, respectively. FIGS. 20A, 20B, and 20C schematically illustrate a lower level, a middle level, and an upper level of a NOR cell 124. FIGS. 21A, 21B, and 21C schematically illustrate a lower level, a middle level, and an upper level of an AND-OR-Invert (AOI) cell 126. The details of these cells may be realized from the disclosure of the inverter cell 104, and are not discussed in detail herein.

With the design of the front-side and back-side power lines, the standard cells may be placed next to each other to form functional circuits. Accordingly, the front-side power lines of the neighboring cells are joined to each other to form long power lines, and the back-side power lines of the neighboring cells are joined to each other to form long power lines. Furthermore, in both of the front side and the backside, VDD lines and VSS lines may be allocated alternatingly.

The embodiments of the present disclosure have some advantageous features. By conducting front-side power lines to the backside of vertical transistors, and supplying power to the lower source/drain regions of the vertical transistors from the backside power lines, the chip area of the resulting circuit is reduced. The design and the layout of the circuits are also more flexible.

In accordance with some embodiments of the present disclosure, a method includes forming a first vertical transistor comprising forming a first vertical semiconductor bar over a substrate; forming a first gate dielectric and a first gate electrode encircling the first vertical semiconductor bar; forming a first source/drain region over a top surface of the first vertical semiconductor bar; removing the substrate to reveal a bottom surface of the first vertical semiconductor bar; and forming a second source/drain region contacting the bottom surface of the first vertical semiconductor bar; and forming a first backside power line, wherein the first backside power line is on a bottom side of the first vertical semiconductor bar, and wherein the first backside power line is connected to the second source/drain region.

In an embodiment, the method further comprises forming a first front-side power line over the first source/drain region; and forming a first deep via connecting the first front-side power line to the first backside power line. In an embodiment, the first deep via comprises opposing surfaces in physical contact with the first front-side power line and the first backside power line. In an embodiment, the first front-side power line and the first backside power line have lengthwise directions parallel to each other. In an embodiment, the method further comprises forming a source/drain contact plug electrically connecting to the second source/drain region, wherein the source/drain contact plug comprises a portion overlapping a portion of the first front-side power line.

In an embodiment, the first front-side power line and the first backside power line are VDD lines, and the method further comprises forming a second front-side power line parallel to, and in a same metal layer as, the first front-side power line, wherein the second front-side power line is a VSS line; and forming a second backside power line parallel to, and in a same metal layer as, the second front-side power line; and forming a second deep via between, and physically contacting both of, the second front-side power line and the second backside power line.

In an embodiment, the method further comprises forming a second vertical transistor comprising forming second vertical semiconductor bar over the substrate; forming a second gate dielectric and a second gate electrode encircling the second vertical semiconductor bar; forming a third source/drain region over a top surface of the second vertical semiconductor bar; and after the substrate is removed, forming a fourth source/drain region contacting a bottom surface of the second vertical semiconductor bar.

In an embodiment, the method further comprises forming a gate pad connecting the first gate electrode to the second gate electrode; and forming a vertical contact plug over and contacting the gate pad. In an embodiment, the forming the first source/drain region and the forming the second source/drain region comprise selective epitaxy processes. In an embodiment, the method further comprises depositing a passivation layer underlying and contacting the first backside power line.

In accordance with some embodiments of the present disclosure, a structure comprises a first vertical transistor comprising first vertical semiconductor bar; a first gate dielectric and a first gate electrode encircling the first vertical semiconductor bar; a first source/drain region over a top surface of the first vertical semiconductor bar; a second source/drain region contacting a bottom surface of the first vertical semiconductor bar; a first front-side power line overlying the first vertical transistor; and a first backside power line electrically connected to the first front-side power line, wherein the first backside power line is underlying the first vertical semiconductor bar, and wherein the first backside power line is connected to the second source/drain region.

In an embodiment, the structure further comprises a second vertical transistor comprising a second gate electrode electrically connecting to the first gate electrode. The structure further comprises a second front-side power line over the first vertical transistor and parallel to the first front-side power line; and a second backside power line electrically connected to, and overlapped by the second front-side power line, wherein the first backside power line is a VDD line, and the second backside power line is a VSS line. In an embodiment, the first vertical transistor and the second vertical transistor form an inverter.

In an embodiment, the structure a deep via between, and in contact with both of, the first front-side power line and the first backside power line. In an embodiment, the first source/drain region and the second source/drain region comprise epitaxy semiconductor regions. In an embodiment, the first front-side power line and the first backside power line are elongated, and comprise lengthwise directions parallel to each other. In an embodiment, the structure a blanket passivation layer on a backside of the first vertical transistor and contacting the first backside power line, wherein the blanket passivation layer is free from conductive features penetrating through.

In accordance with some embodiments of the present disclosure, a structure comprises a first vertical transistor comprising a first vertical channel; and a first gate electrode encircling the first vertical channel; a second vertical transistor comprising a second vertical channel; and a second gate electrode encircling the second vertical channel; a gate pad connecting the first gate electrode to the second gate electrode; a gate contact plug over and contacting the gate pad; a front-side VDD power line and a front-side VSS power line over the first vertical transistor; and a backside VDD power line and a backside VSS power line underlying the first vertical transistor, wherein the backside VDD power line is overlapped by, and is electrically connected to, the front-side VDD power line, and the backside VSS power line is overlapped by, and is electrically connected to the front-side VSS power line.

In an embodiment, the first vertical transistor comprises an upper source/drain region over the first vertical channel; and a lower source/drain region under the first vertical channel, wherein the lower source/drain region is connected to one of the backside VDD power line and the backside VSS power line. In an embodiment, the first vertical transistor and the second vertical transistor are interconnected as an inverter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming a first vertical transistor comprising:
forming a first vertical semiconductor bar over a substrate;
forming a first gate dielectric and a first gate electrode encircling the first vertical semiconductor bar;
forming a first source/drain region over a top surface of the first vertical semiconductor bar;
removing the substrate to reveal a bottom surface of the first vertical semiconductor bar; and
forming a second source/drain region contacting the bottom surface of the first vertical semiconductor bar; and
forming a first backside power line, wherein the first backside power line is on a bottom side of the first vertical semiconductor bar, and wherein the first backside power line is connected to the second source/drain region.
2. The method of claim 1 further comprising:
forming a first front-side power line over the first source/drain region; and
forming a first deep via connecting the first front-side power line to the first backside power line.
3. The method of claim 2, wherein the first deep via comprises opposing surfaces in physical contact with the first front-side power line and the first backside power line.
4. The method of claim 2, wherein the first front-side power line and the first backside power line have lengthwise directions parallel to each other.
5. The method of claim 2 further comprising:
forming a source/drain contact plug electrically connecting to the second source/drain region, wherein the source/drain contact plug comprises a portion overlapping a portion of the first front-side power line.
6. The method of claim 2, wherein the first front-side power line and the first backside power line are VDD lines, and the method further comprises:

13

14 forming a second front-side power line parallel to, and in a same metal layer as, the first front-side power line, wherein the second front-side power line is a VSS line;

forming a second backside power line parallel to, and in a same metal layer as, the second front-side power line; and forming a second deep via between, and physically contacting both of, the second front-side power line and the second backside power line.

7. The method of claim 1 further comprising forming a second vertical transistor comprising:

forming a second vertical semiconductor bar over the substrate;

forming a second gate dielectric and a second gate electrode encircling the second vertical semiconductor bar;

forming a third source/drain region over a top surface of the second vertical semiconductor bar; and after the substrate is removed, forming a fourth source/drain region contacting a bottom surface of the second vertical semiconductor bar.

8. The method of claim 7 further comprising forming a gate pad connecting the first gate electrode to the second gate electrode; and forming a vertical contact plug over and contacting the gate pad.

9. The method of claim 1, wherein the forming the first source/drain region and the forming the second source/drain region comprise selective epitaxy processes.

10. The method of claim 1 further comprising depositing a passivation layer underlying and contacting the first backside power line.

11. A method comprising:

forming a first vertical transistor comprising:

forming a first vertical semiconductor bar over a substrate;

forming a first gate dielectric and a first gate electrode encircling the first vertical semiconductor bar;

forming a first source/drain region over a top surface of the first vertical semiconductor bar;

removing the substrate to reveal a bottom surface of the first vertical semiconductor bar, wherein the removing the substrate results in a part of the first gate dielectric to be exposed; and forming a second source/drain region contacting the bottom surface of the first vertical semiconductor bar; and forming a first backside power line, wherein the first backside power line is on a bottom side of the first vertical semiconductor bar, and wherein the first backside power line is connected to the second source/drain region.

12. The method of claim 11 further comprising:

forming a first front-side power line over the first source/drain region; and forming a first deep via connecting the first front-side power line to the first backside power line.

13. The method of claim 12, wherein the first deep via comprises opposing surfaces in physical contact with the first front-side power line and the first backside power line.

14. The method of claim 12 further comprising:

forming a source/drain contact plug electrically connecting to the second source/drain region, wherein the source/drain contact plug comprises a portion overlapping a portion of the first front-side power line.

15. The method of claim 12, wherein the first front-side power line and the first backside power line are VDD lines, and the method further comprises:

forming a second front-side power line parallel to, and in a same metal layer as, the first front-side power line, wherein the second front-side power line is a VSS line;

forming a second backside power line parallel to, and in a same metal layer as, the second front-side power line; and forming a second deep via between, and physically contacting both of, the second front-side power line and the second backside power line.

16. The method of claim 11 further comprising forming a second vertical transistor comprising:

forming a second vertical semiconductor bar over the substrate;

forming a second gate dielectric and a second gate electrode encircling the second vertical semiconductor bar;

forming a third source/drain region over a top surface of the second vertical semiconductor bar; and after the substrate is removed, forming a fourth source/drain region contacting a bottom surface of the second vertical semiconductor bar.

17. A method comprising:

forming a vertical transistor comprising:

forming a vertical semiconductor bar over a substrate;

forming a gate dielectric and a gate electrode encircling the vertical semiconductor bar;

forming a first source/drain region over a top surface of the vertical semiconductor bar;

removing the substrate to reveal a bottom surface of the vertical semiconductor bar; and forming a second source/drain region contacting the bottom surface of the vertical semiconductor bar;

forming a gate pad contacting the gate electrode;

forming a front-side gate contact plug and a backside gate contact plug on opposite sides of, and contacting a top surface and a back surface, respectively, of the gate pad; and forming a backside power line, wherein the backside power line is on a bottom side of the vertical semiconductor bar, and wherein the backside power line is connected to the second source/drain region.

18. The method of claim 17, wherein the forming the first source/drain region and the forming the second source/drain region comprise selective epitaxy processes.

19. The method of claim 17, wherein the front-side gate contact plug and the backside gate contact plug are tapered in opposite tapering directions.

20. The method of claim 17, wherein the gate dielectric is exposed after the substrate is removed.

* * * * *